US009997998B2

(12) United States Patent
Ogawa et al.

(10) Patent No.: US 9,997,998 B2
(45) Date of Patent: Jun. 12, 2018

(54) ELECTRONIC CIRCUIT AND BOOST CONVERTER

(71) Applicant: KABUSHIKI KAISHA TOSHIBA, Minato-ku (JP)

(72) Inventors: Taichi Ogawa, Inagi (JP); Takeshi Ueno, Kawasaki (JP); Tetsuro Itakura, Nerima (JP); Osamu Watanabe, Chigasaki (JP); Takayuki Miyazaki, Setagaya (JP); Yosuke Toyama, Kawasaki (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days. days.

(21) Appl. No.: 15/444,920

(22) Filed: Feb. 28, 2017

(65) Prior Publication Data
US 2018/0054115 A1    Feb. 22, 2018

(30) Foreign Application Priority Data
Aug. 17, 2016 (JP) ................. 2016-160059

(51) Int. Cl.
*H02M 3/10* (2006.01)
*H02M 3/04* (2006.01)
(Continued)

(52) U.S. Cl.
CPC ............. *H02M 3/04* (2013.01); *H03K 3/037* (2013.01); *H03K 5/159* (2013.01)

(58) Field of Classification Search
CPC .......... H02M 3/04; H02M 3/10; H02M 3/135; H02M 3/145; H02M 3/155; G05F 1/00;
(Continued)

(56) References Cited

U.S. PATENT DOCUMENTS

| | | | | |
|---|---|---|---|---|
| 5,497,263 A | * | 3/1996 | Masuda | ................... G06F 1/10 327/278 |
| 5,500,610 A | * | 3/1996 | Burstein | ............ H03K 17/0822 326/27 |

(Continued)

FOREIGN PATENT DOCUMENTS

| | | |
|---|---|---|
| JP | 63-217820 | 9/1988 |
| JP | 3829753 | 10/2006 |

*Primary Examiner* — Adolf Berhane
(74) *Attorney, Agent, or Firm* — Oblon, McClelland, Maier & Neustadt, L.L.P.

(57) ABSTRACT

An electronic circuit according to one embodiment of the present invention includes a first logic circuit, a second logic circuit, first and second capacitors, and a connection circuit. The first logic circuit has a first output terminal from which a first output signal based on a first input signal is output. The second logic circuit outputs a second output signal obtained by inversion of the first output signal is output in a steady state. The first and second capacitors each have one terminal at a first voltage. The connection circuit connects one of the first output terminal and the second output terminal to the first capacitor, and the other to the second capacitor. The connection circuit interchanges connection destinations of the first capacitor and the second capacitor in accordance with a received first connection control signal.

12 Claims, 15 Drawing Sheets

(51) Int. Cl.
*H03K 5/159* (2006.01)
*H03K 3/037* (2006.01)

(58) Field of Classification Search
CPC ..... G05F 1/10; G05F 1/12; G05F 1/46; G05F 1/40
USPC .......................... 323/234, 265, 266, 268, 271
See application file for complete search history.

(56) References Cited

U.S. PATENT DOCUMENTS

| | | | | |
|---|---|---|---|---|
| 7,034,628 | B1* | 4/2006 | Lu | H03B 5/06 331/158 |
| 2007/0268080 | A1* | 11/2007 | Takeuchi | H03K 3/0231 331/1 A |
| 2009/0309640 | A1* | 12/2009 | Miyazaki | H03K 3/0372 327/202 |
| 2017/0237346 | A1* | 8/2017 | Toyama | H02M 3/157 323/271 |
| 2018/0006561 | A1* | 1/2018 | Toyama | H02M 3/158 |

* cited by examiner

US 9,997,998 B2

ELECTRONIC CIRCUIT AND BOOST CONVERTER

CROSS-REFERENCE TO RELATED APPLICATION (S)

This application is based upon and claims the benefit of priority from Japanese Patent Application No. 2016-160059, filed Aug. 17, 2016; the entire contents of which are incorporated herein by reference.

FIELD

Embodiments described herein relate generally to an electronic circuit and a boost converter.

BACKGROUND

In a delay circuit configured to force a rising edge of an output signal to come after a rising edge of an input signal, a logic circuit consisting of a capacitor and the like included in the delay circuit is in a different state before receiving the input signal and after outputting the output signal given by signal processing. Processing is therefore carried out to return the state after the signal processing to the initial state.

Capacitors are classified into two types: capacitors which are Low in the initial state and remain High after signal processing, and capacitors which are High in the initial state and remain Low after signal processing. The input and output of a NOT gate (inverter) are given as an example. In a common delay circuit, to return the state of a capacitor to the initial state from High to Low, the capacitor is discharged, and from Low to High, the capacitor is charged. However, charging and discharging the capacitor to return the capacitor to the initial state increases power consumption.

DETAILED DESCRIPTION

Embodiments of the present invention provide an electronic circuit such as delay circuit and the like which contributes to a reduction in power consumption due to charging and discharging of the capacitor.

An electronic circuit according to one embodiment of the present invention includes a first logic circuit, a second logic circuit, first and second capacitors, and a connection circuit. The first logic circuit has a first output terminal from which a first output signal based on a first input signal is output. The second logic circuit outputs a second output signal obtained by inversion of the first output signal is output in a steady state. The first and second capacitors each have one terminal at a first voltage. The connection circuit connects one of the first output terminal and the second output terminal to the first capacitor, and the other to the second capacitor. The connection circuit interchanges connection destinations of the first capacitor and the second capacitor in accordance with a received first connection control signal.

Below, a description is given of embodiments of the present invention with reference to the drawings. The present invention is not limited to the embodiments.

First Embodiment

Figure 1:
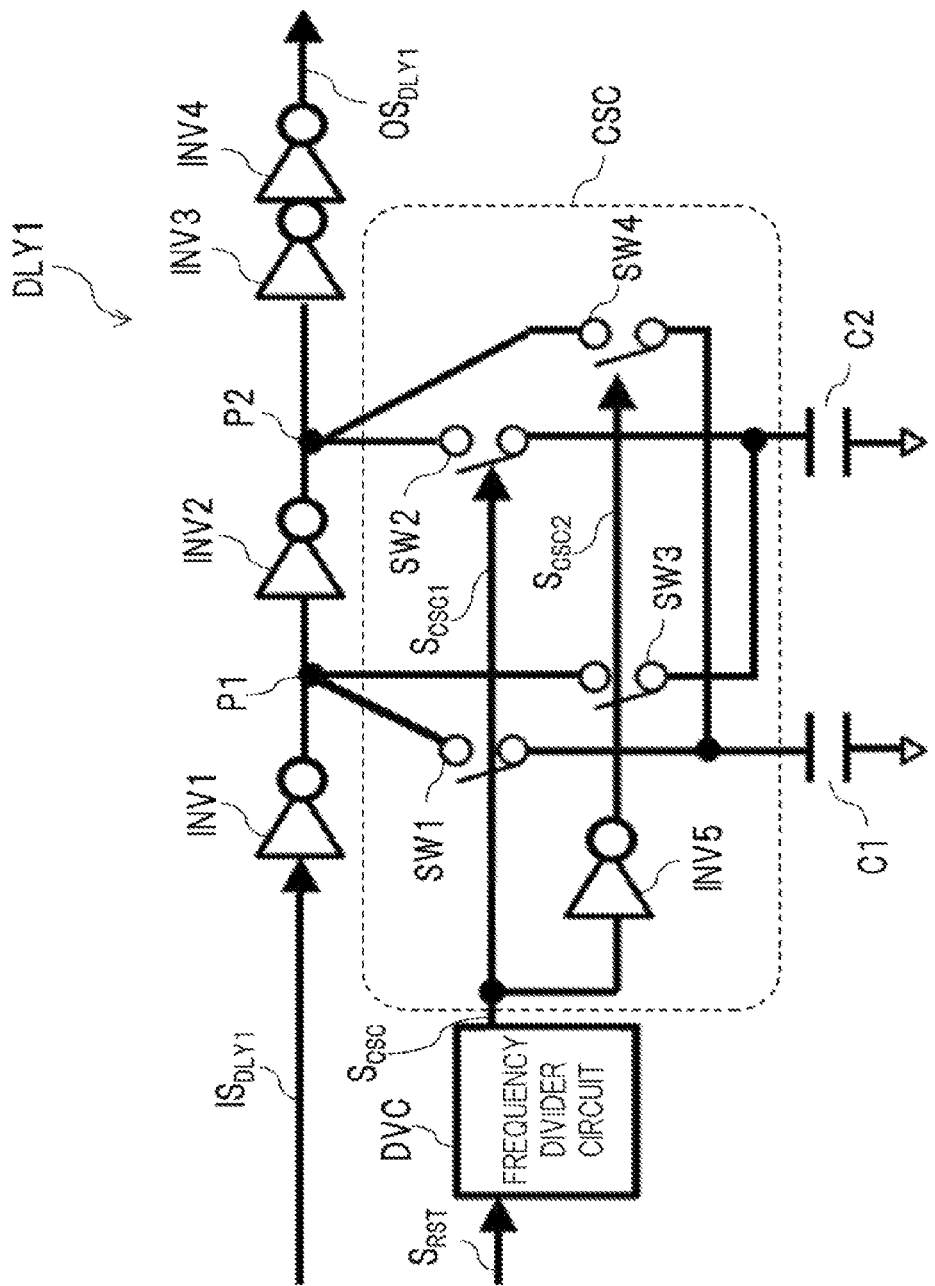
FIG. 1 is a block diagram schematically illustrating an example configuration of a delay circuit according to a first embodiment.

FIG. 1 is a block diagram schematically illustrating an example configuration of a delay circuit according to the first embodiment. A delay circuit (DLY1) according to the first embodiment includes four inverters (INV1 to INV4), two capacitors (C1 and CS2), a frequency divider circuit (DVC), and a connection switching circuit (CSC). The connection switching circuit CSC includes four switches (SW1 to SW4) and one inverter (INV5).

It should be noted that this configuration is illustrative only, and any other components may be added or any of the components disclosed here may be omitted as long as the same effects as those provided by this embodiment can be provided. For example, components may be connected either directly or indirectly via a logic circuit. A logic circuit in this description may consist of either a single logic element or a plurality of logic elements.

In the description below, an input signal to each logic circuit is referred to as "IS", and an output signal from each logic circuit as "OS". The departure logic circuit of an input signal and the destination logic circuit of an output signal are expressed by the signs after "IS" and "OS", respectively. For example, the input signal to the inverter INV1 is referred to as "$IS_{INV1}$". A signal intended for special use and the like is expressed by "S" with the respective signs indicating the signals and the like. For example, a reset signal input to DLY1 is referred to as "$S_{RST}$". The reset signal $S_{RST}$ returns the delay circuit DLY1 to the original state.

The delay circuit DLY1 receives the input signal $IS_{DLY1}$ and the reset signal $S_{RST}$, and outputs (produces) the output signal $OS_{DLY1}$. According to a delay time predetermined by the delay circuit DLY1, the time at which the voltage of the output signal $OS_{DLY1}$ changes is behind the time at which the voltage of the input signal $IS_{DLY1}$ changes.

After the delay circuit DLY1 causes the voltage of the output signal $OS_{DLY1}$ to change after the voltage of the input signal $IS_{DLY1}$ changes, i.e., after the signal processing in the delay circuit DLY1, the voltage in the delay circuit DLY1 changes. In a typical delay circuit, charging and discharging a capacitor returns the changed voltage to the original state. Meanwhile, in the delay circuit DLY1, the connection switching circuit CSC switches the connection destinations, thereby returning the voltage of the delay circuit DLY1 to the original state. Changes in the voltage of the delay circuit DLY1 will be explained later. It should be noted that the signal processing in the delay circuit DLY1 is referred to as "delay processing".

The inverters INV1 to INV4 are connected in series as shown in FIG. 1. The input signal $IS_{DLY1}$ received by the delay circuit DLY1 passes, in sequence, the inverters INV1, INV2, INV3, and INV4 and eventually appears at the output of the inverter INV4 as the output signal $OS_{DLY1}$ of the delay circuit DLY1. The inverters INV3 and INV4 are provided to adjust the potential difference between the input signal $IS_{DLY1}$ and the output signal $OS_{DLY1}$, and the time of delay processing. However, the inverters INV3 and INV4 are optional elements.

Each inverter outputs the signal inverted from the input signal but when the impedances of the loads in the circuit to which the inverter belongs are low, the output signal of the inverter is not readily inverted and a delay time therefore occurs. The state where the output signal of the inverter is changing to an inverted signal is referred to as a "transient state", and the state after the output signal of the inverter became the inverted signal is referred to as a "steady state". A typical delay circuit includes connected capacitors as loads as in this embodiment to intentionally make the transient state longer and thus adjust the delay time.

The level (High or Low) of the voltage of the output signal of the inverter is determined by a comparison between an inversion threshold predetermined in the inverter and the input voltage. If the input voltage is higher than the inversion threshold, the voltage of the output signal of the inverter becomes Low. If the input voltage is lower than the inversion threshold, the voltage of the output signal of the inverter becomes High. The inversion threshold is programmable and is typically about the half of the drive voltage for the inverter.

The node between the output terminal of the inverter INV1 (the first logic circuit) and the input terminal of the inverter INV2 (the second logic circuit) is denoted by "P1". The node between the output terminal of the inverter INV2 and the input terminal of the inverter INV3 is denoted by "P2". In the steady state, the voltage $V_{P1}$ of the node P1 the voltage $V_{P2}$ of the node P2 are inverted due to processing in the inverter INV2.

Each of the two capacitors C1 and C2 has one terminal at the ground voltage (reference voltage). The other terminal of each of the capacitors C1 and C2 is connected to the node P1 or P2 via the connection switching circuit CSC. The details will be described later.

The frequency divider circuit DVC receives an external reset signal $S_{RST}$. The frequency divider circuit DVC sends a connection control signal (the first connection control signal) based on the reset signal $S_{RST}$ to the connection switching circuit CSC. The connection control signal is defined by $S_{CSC}$. The connection control signal $S_{CSC}$ is used to switch the connection states of the switches SW1 to SW4 in the connection switching circuit CSC.

To be specific, the frequency divider circuit DVC inverts the voltage of the connection control signal $S_{CSC}$ when the voltage of the reset signal $S_{RST}$ changes from Low to High. It should be noted that the connection control signal $S_{CSC}$ from the exterior may be directly input to the delay circuit DLY1, and in this case, the frequency divider circuit DVC is not necessarily provided.

The connection switching circuit CSC connects the capacitors C1 and C2 to the node P1 or P2. Note that the capacitors C1 and C2 are always connected to different nodes. In particular, the connection switching circuit CSC connects one of the nodes P1 and P2 to the capacitor C1, and the other to the capacitor C2. In the steady state, the voltage of the node P1 and the voltage of the node P2 are opposite, and the voltage of the capacitor C1 and the voltage of the capacitor C2 are therefore opposite.

The connection switching circuit CSC performs exchange between the nodes to which the capacitors C1 and C2 are connected, in accordance with the received connection control signal $S_{CSC}$. To be specific, the exchange is performed when the voltage of the connection control signal $S_{CSC}$ is inverted. Since inversion of the voltage depends on the reset signal $S_{RST}$, the reset signal $S_{RST}$ also serves as a signal for instruction to exchange the target nodes. For example, when the capacitor C1 is connected to the node P1 and the capacitor C2 is connected to the node P2, the connection switching circuit CSC performs exchange such that the capacitor C1 is connected to the node P2 and the capacitor C2 is connected to the node P1. This exchange is performed to return the changed voltage of the delay circuit DLY1 to the original state without charging and discharging the capacitors C1 and C2. The details will be described later.

The operation of the connection switching circuit CSC will now be described in detail. The connection switching circuit CSC sends the connection control signal $S_{CSC}$ to the switches SW1 and SW2. The connection control signal $S_{CSC}$ is used to switch on (Short) or off (Open) the switches SW1 and SW2. The connection control signal $S_{CSC}$ is input to the inverter INV5. INV5 outputs the inverted signal of the connection control signal $S_{CSC}$. The inverted signal of the connection control signal $S_{CSC}$ is used to switch on or off the switches SW3 and SW4. In the description below, a connection control signal for SW1 and SW2 is defined by $S_{CSC1}$, and a connection control signal for SW3 and SW4 is defined by $S_{CSC2}$. Hence, the connection control signal $S_{CSC1}$ is the same as the connection control signal $S_{CSC}$ and corresponds to the inverted signal of the connection control signal $S_{CSC2}$.

The switch SW1 is present between the node P1 and the other end of the capacitor C1, and switches the connection state between the node P1 and the capacitor C1 in accordance with the connection control signal $S_{CSC1}$. The switch SW2 is present between the node P2 and the other end of the capacitor C2, and switches the connection state between the node P2 and the capacitor C2 in accordance with the connection control signal $S_{CSC1}$. The switch SW3 is present between the node P1 and the other end of the capacitor C2, and switches the connection state between the node P1 and the capacitor C2 in accordance with the connection control signal $S_{CSC2}$. The switch SW4 is present between the node P2 and the other end of the capacitor C1, and switches the connection state between the node P2 and the capacitor C1 in accordance with the control signal $S_{CSC2}$. Accordingly, the connection switching circuit CSC can perform exchange between the nodes to which the capacitors C1 and C2 are connected, in accordance with the connection control signal $S_{CSC}$.

Figure 2:
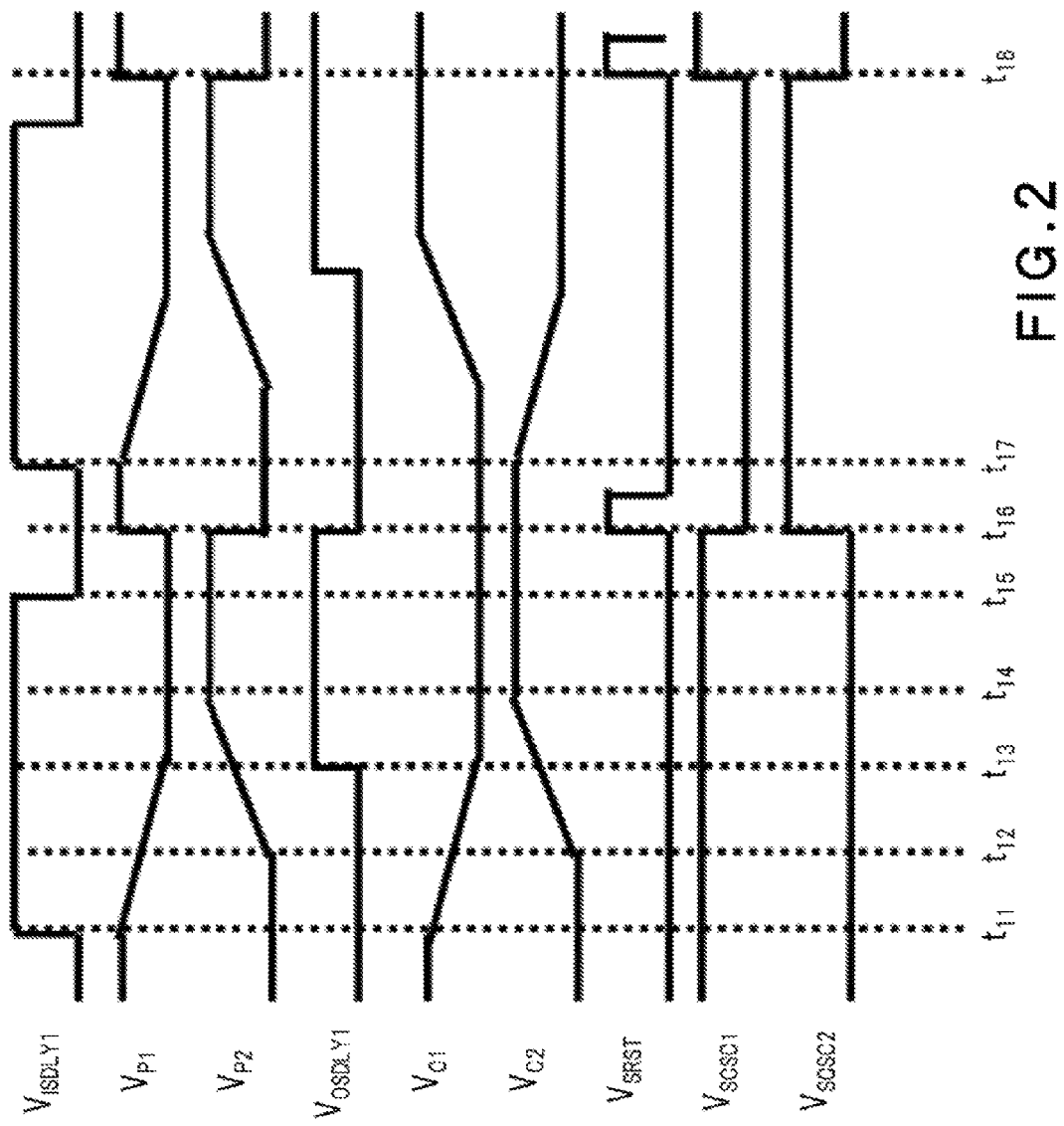
FIG. 2 shows the waveforms of the voltages in the delay circuit according to the first embodiment.

The operation of the delay circuit DLY1 will now be described. FIG. 2 shows the waveforms of the voltages in the delay circuit according to the first embodiment. The voltages of signals, nodes, and the like are denoted by "V" with the respective signs indicating the signals and the like. FIG. 2 shows, from the top, the voltage $V_{ISDLY1}$ of the input signal $IS_{DLY1}$, the voltage $V_{P1}$ of the node P1, the voltage $V_{P2}$ of the node P2, the voltage $V_{OSDLY1}$ of the output signal $OS_{DLY1}$, the voltage $V_{C1}$ of the capacitor C1, the voltage $V_{C2}$ of the capacitor C2, the voltage $VS_{RST}$ of the reset signal $S_{RST}$, the voltage $V_{SCSC1}$ of the connection control signal $S_{CSC1}$, and the voltage $V_{SCS2}$ of the connection control signal $S_{CSC2}$.

The state of the voltage of the delay circuit DLY1 before the time t11 is the initial state. In the case shown in FIG. 2, in the initial state, the voltage $V_{ISDLY1}$, the voltage $V_{P2}$, and the voltage $V_{OSDLY1}$ are Low, and the voltage $V_{P1}$ is High. In the case shown in FIG. 2, when the voltage $V_{ISDLY1}$ is High, the voltage $V_{ISDLY1}$ is equal to the power voltage $V_{DD}$ for driving the delay circuit DLY1. When the voltage $V_{ISDLY1}$ is Low, the voltage $V_{ISDLY1}$ is equal to the ground voltage $V_{GND}$.

Note that the voltage $V_{C1}$ and the voltage $V_{C2}$ in the initial state may be either High or Low as long as they are opposite levels. In the case shown in FIG. 2, the voltage $V_{C1}$ is High and the voltage $V_{C2}$ is Low before the time t11, but after the return to the initial state due to the delay processing, the voltage $V_{C1}$ may be Low and the voltage $V_{C2}$ may be High. In this case, the connection destinations of the capacitors C1 and C2 are opposite to before the time t11, and the delay circuit DLY1 operates in the same way even in this case.

At the time t11, if the voltage $V_{ISDLY1}$ becomes High, the voltage $V_{P1}$ starts to decrease. Accordingly, at the time t11, the delay circuit DLY1 is in the transient state. If the voltage $V_{P1}$ falls below the inversion threshold of the inverter INV2 at the time t12, the inverter INV2 increases the voltage $V_{P2}$ after the time t12. If the voltage $V_{P2}$ exceeds the inversion threshold of the inverter INV3 at the time t13, the voltage of the output signal of the inverter IVN13 becomes Low and the voltage of the output signal of the inverter INV4 becomes High at the time t13. In other words, at the time t13, the voltage $V_{OSDLY1}$ of the output signal $OS_{DLY1}$ becomes High and the voltage $V_{OSDLY1}$ changes from $V_{GND}$ to the power voltage $V_{DD}$.

The delay time of the delay circuit can be adjusted with the capacitors C1 and C2. For example, in the case shown in FIG. 2, from the time t11 to t12, the voltage $V_{SCSC1}$ stays High, so that the capacitor C1 is connected to the node P1, that is, the output terminal of the inverter INV1. For this reason, if the capacitance of the capacitor C1 is large, a reduction in voltage $V_{P1}$ is smaller and the time from the time t11 to time t12 is longer. In contrast, if the capacitance of the capacitor C2 is large, an increase in voltage $V_{P2}$ is smaller and the time from the time t12 to time t13 is longer. Adjusting the capacitances of the capacitors C1 and C2 in advance as described above allows adjustment of the time from the time t11 to t12 and the time from the time t12 to t13, thereby determining the delay time of the delay circuit.

The operation after the delay processing will now be explained. Suppose that, as shown in FIG. 2, the voltage $V_{ISDLY11}$ of the input signal $IS_{DLY1}$ changes to Low at the time t15 and returns to High at the time t17. In this case, the state of DLY1 of the delay circuit should be returned to the initial state from the time t15 to t17. For this reason, the voltage $V_{SRST}$ of the reset signal $S_{RST}$ is forced High from the time t15 to t17.

Suppose that the voltage $V_{SRST}$ of the reset signal $S_{RST}$ becomes High at the time t16. Consequently, the values of the voltage $V_{SCSC1}$ and the voltage $V_{SCSC2}$ are interchanged. Subsequently, the switches SW1 and SW2 turn off, and the switches SW3 and SW4 turn on.

Therefore, the capacitor C1 is connected to the node P2, and the capacitor C2 is connected to the node P1.

The voltage $V_{P1}$ of the node P1, which is Low before the switching of the connection destination, becomes High at the time t16 because it is connected to the capacitor C2 being High. The voltage $V_{P2}$ of the node P2, which is High before the switching of the connection destination, becomes Low at the time t16 because it is connected to the capacitor C1 being Low. Thus, the voltage $V_{P1}$ and the voltage $V_{P2}$ both return to the initial states. Hence, the delay circuit DLY1 can be returned to the initial state.

Although the voltage $V_{P1}$ of the node P1 in the initial state is Low in the case shown in FIG. 2, the voltage $V_{P1}$ of the node P1 in the initial state may be High instead. Thus, if the voltage of the connection control signal $S_{CSC1}$ changes during the period from when the voltage $V_{P1}$ of the node P1 changes from a predetermined value and to when it returns to the predetermined value, the delay circuit DLY1 returns to the initial state after delay processing.

This embodiment assumes that the period from the time t15 when the voltage $V_{ISDLY1}$ of the input signal $IS_{DLY1}$ becomes Low to the time t16 when the voltage $V_{SRST}$ of the reset signal $S_{RST}$ becomes High is short. Accordingly, this embodiment assumes that the delay circuit DLY1 barely has fluctuations in voltage and thus ignores such voltage fluctuations.

In addition, the design relating to this embodiment is made such that the capacitances of the capacitors C1 and C2 are adequately larger than the output capacitances of the inverters INV1 and INV2 so that voltage fluctuations due to charge transfer cause by connection switching can be negligible.

As described above, in the first embodiment, after delay processing in the delay circuit DLY1, the connection destinations of the capacitors C1 and C2 at different voltages are switched, so that the voltage of the delay circuit DLY1 can be returned to the initial state without charging and discharging. Thus, the power consumption is less than with charging and discharging. Moreover, the delay time can be adjusted based on the capacitances of the capacitors C1 and C2.

Second Embodiment

Figure 3:
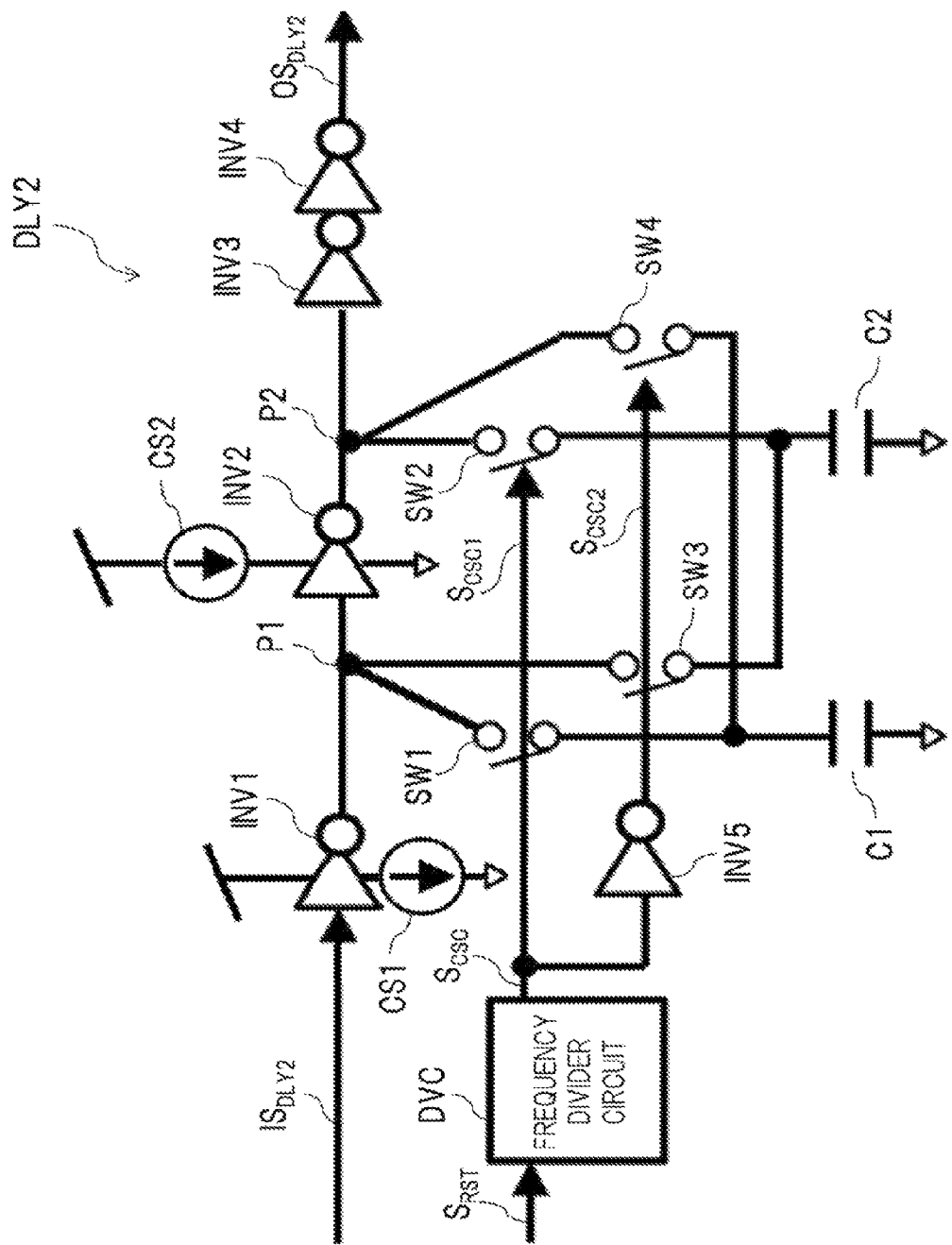
FIG. 3 is a block diagram schematically illustrating an example configuration of a delay circuit according to a second embodiment.

FIG. 3 is a block diagram schematically illustrating an example configuration of a delay circuit according to the second embodiment. A delay circuit (DLY2) according to the second embodiment further includes two current sources (CS1 and CS2) in comparison with the first embodiment. Although the two current sources CS1 and CS2 are provided in the case shown in FIG. 3, only one of them may be provided instead. The description of the same part as in the above-described embodiment will be omitted. Similarly, in the description of the following embodiments, the description of the same part as in the former embodiments will be omitted.

The current source CS1 is connected between the inverter INV1 and the ground voltage $V_{GND}$.

The current source CS2 is connected between the inverter INV2 and the power voltage $V_{DD}$.

The current sources CS1 and CS2 can increase or decrease the amount of the flowing current. Accordingly, the delay circuit DLY2 can adjust the amount of the current charged into the capacitor C1 and the amount of the current discharged from capacitor C2. Hence, the periods in which the capacitors C1 and C2 are in the transient state can be increased or decreased. In other words, the delay time of the delay circuit can be adjusted.

The current sources CS1 and CS2 can reduce flow-through current flowing at the inversion of the inverter. Consequently, the power consumption of the delay circuit DLY2 can be reduced.

As described above, in the second embodiment, the delay time of the delay circuit DLY2 can be adjusted due to the current source CS1 or CS2. This enables to enhance the flexibility in the design of the delay circuit DLY2. Further, reducing flow-through current allows a reduction in the power consumption of the delay circuit DLY2.

Third Embodiment

The embodiment described above assumes that the period from the time when the voltage of the input signal $IS_{DLY1}$ becomes Low to the time when the voltage of the reset signal $S_{RST}$ becomes High is short and thus ignores voltage fluctuations in the delay circuit DLY1. In addition, the capacitances of the capacitors C1 and C2 are adequately larger than the output capacitances of the inverters INV1 and INV2 so that voltage fluctuations due to charge transfer can be negligible. The third embodiment assumes that such voltage fluctuations are not negligible.

Figure 4:
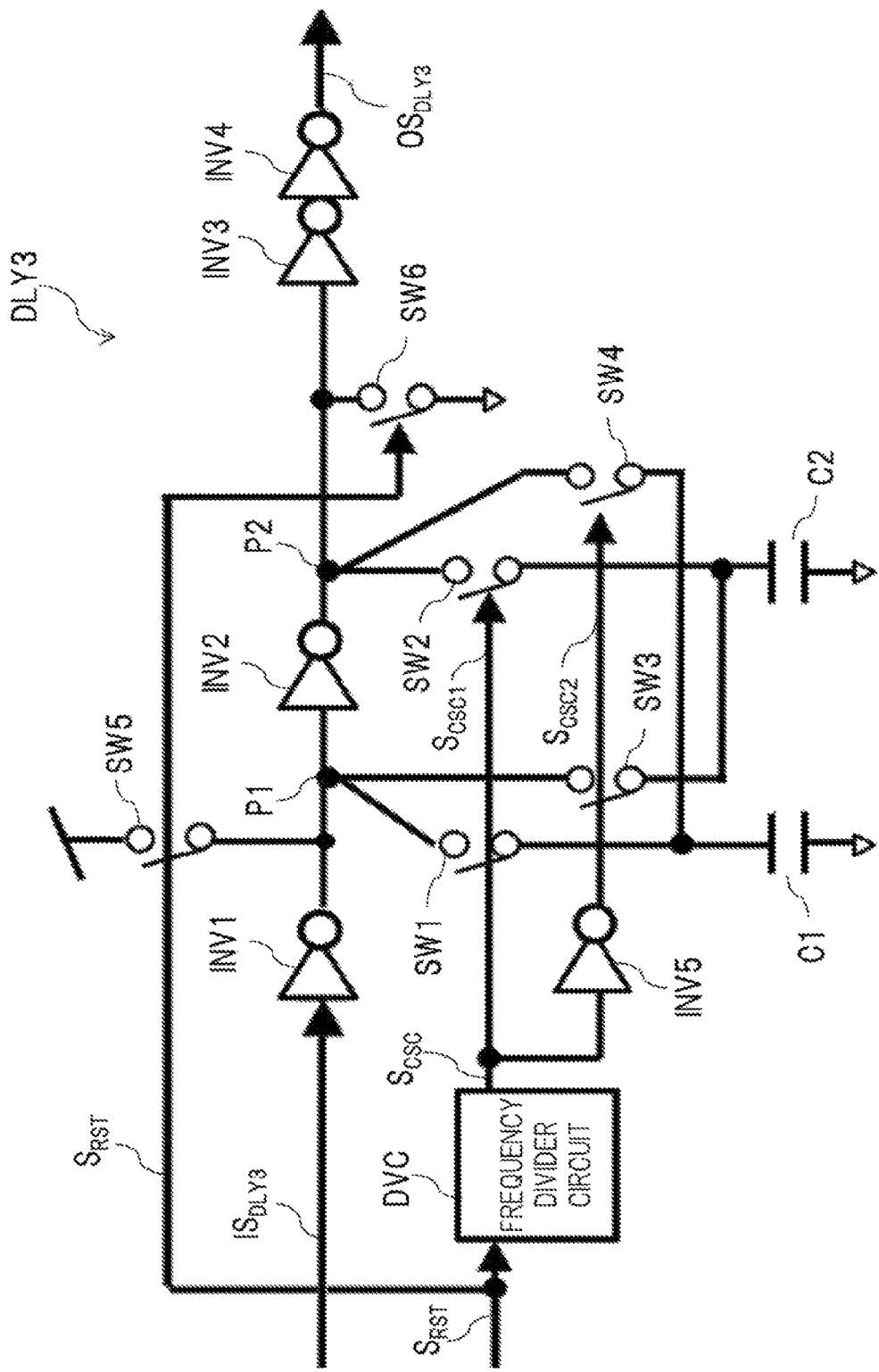
FIG. 4 is a block diagram schematically illustrating an example configuration of a delay circuit according to a third embodiment.

FIG. 4 is a block diagram schematically illustrating an example configuration of a delay circuit according to the third embodiment. A delay circuit (DLY3) according to the third embodiment is similar to the delay circuits according to the above-described embodiments but further includes two switches (SW5 and SW6). The third embodiment in FIG. 4 is illustrated based on the first embodiment but may be illustrated based on any other embodiment. Similarly, the embodiments which will be described later are based on the first embodiment but may be based on any other embodiment unless otherwise specified. Although the two switches SW5 and SW6 are provided in the case shown in FIG. 4, only one of them may be provided instead.

The switch SW5 is present between the output terminal of the inverter INV1 and the power voltage $V_{DD}$. The switch SW6 is present between the output terminal of the inverter INV2 and the ground voltage $V_{GND}$.

The switches SW5 and SW6 receive the reset signal $S_{RST}$. The reset signal $S_{RST}$ is used to switch on or off the switches SW5 and SW6. To be specific, the switch SW5 switches the connection state between the output terminal of the inverter INV1 and the power voltage $V_{DD}$ in accordance with the reset signal $S_{RST}$. The switch SW6 switches the connection state between the output terminal of the inverter INV2 and the ground voltage $V_{GND}$ in accordance with the reset signal $S_{RST}$.

Figure 5:
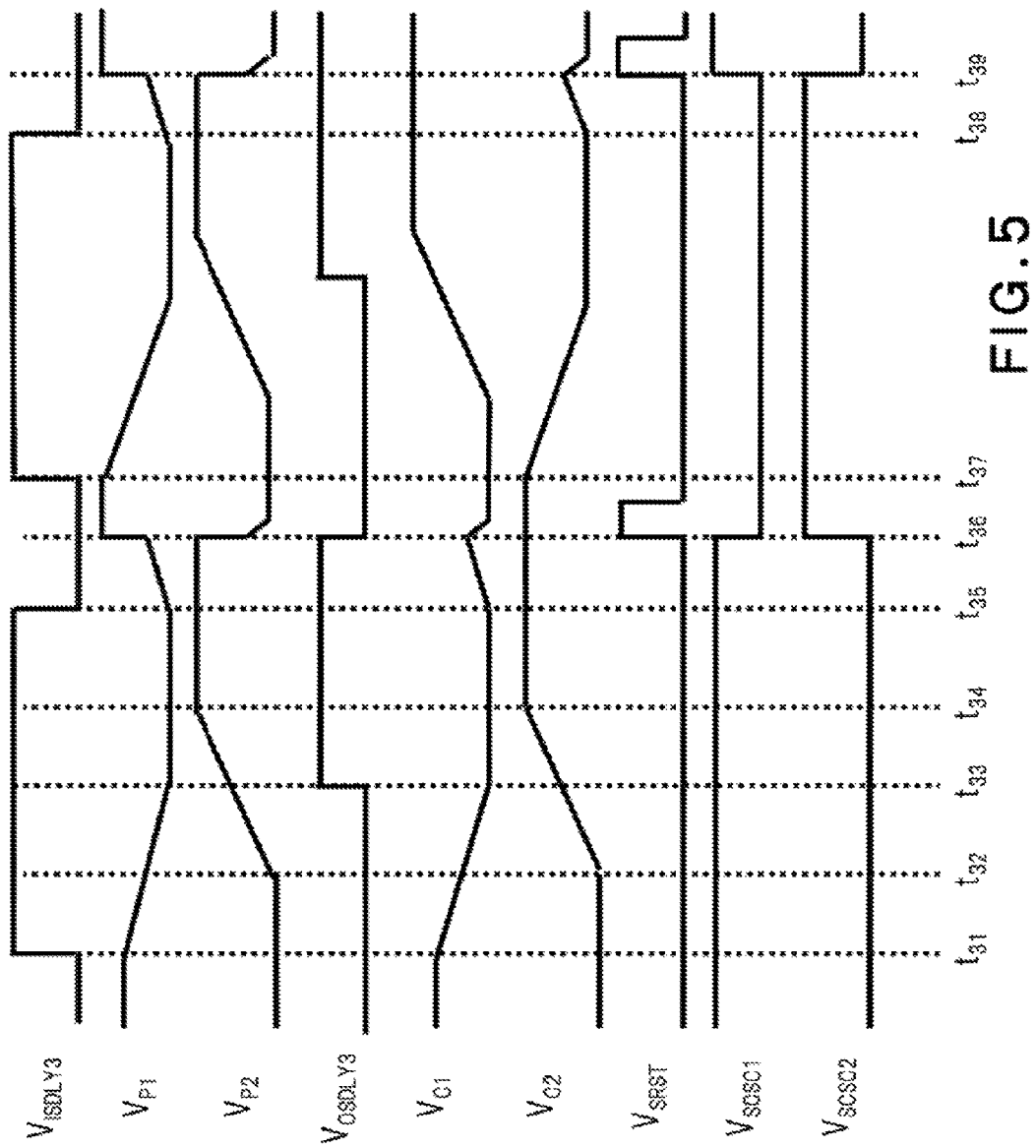
FIG. 5 shows the waveforms of the voltages in the delay circuit according to the third embodiment.

FIG. 5 shows the waveforms of the voltages in the delay circuit according to the third embodiment. From the time t35 at which the voltage $V_{ISDLY3}$ of the input signal $IS_{DLY3}$ becomes Low to the time t36 at which the voltage $VS_{SRST}$ of the reset signal $S_{RST}$ becomes High, the voltage of the output signal of the inverter INV1 stays High, so that the voltage $V_{P1}$ of the node P1 and the voltage $V_{C1}$ of the capacitor C1 connected to the node P1 gradually increase. Even if the voltage $V_{P1}$ increases, the voltage of the output signal of the inverter INV2 stays High while the voltage $V_{P1}$ is below the inversion threshold of the inverter INV2; thus, the voltage $V_{P2}$ of the node P2 and the voltage $V_{C2}$ of the capacitor C2 connected to the node P2 do not fluctuate.

When the voltage $S_{SRST}$ of the reset signal $S_{RST}$ becomes High at the time t36, as in the first embodiment, the voltage $V_{SCSC1}$ of the connection control signal $S_{CSC1}$ and the voltage $V_{SCSC2}$ of the connection control signal $S_{CSC2}$ interchange, and the connection destinations of the capacitors C1 and C2 interchange. Accordingly, the voltage $V_{P1}$ of the node P1 connected to the capacitor C2 at a higher voltage instantaneously rises. Meanwhile, the voltage $V_{P2}$ of the node P1 connected to the capacitor C1 instantaneously drops. However, without the switch SW5, the voltage $V_{P1}$ does not increase to the power voltage $V_{DD}$ because of voltage fluctuations due to charge transfer. Without the switch SW6, the voltage $V_{C1}$ increases by the time t36, and the voltage $V_{P2}$ does not decrease to the ground voltage $V_{GND}$. Thus, this state is different from the initial state.

Meanwhile, in this embodiment, the switch SW5 turns on in sync with the reset signal $S_{RST}$ at the time t36. Consequently, the power voltage $V_{DD}$ is connected to the output terminal of the inverter INV1, and the voltage $V_{P1}$ increases to the power voltage $V_{DD}$. Besides, the switch SW6 turns on in sync with the reset signal $S_{RST}$ at the time t36. The ground voltage $V_{GND}$ is therefore connected to the output terminal of the inverter INV2, and the voltage $V_{P2}$ drops to the ground voltage $V_{GND}$. Thus, in this embodiment, the delay circuit returns to the initial state.

As described above, in this embodiment, the switch SW5 or SW6 is switched at the same time as when the connection switching circuit CSC interchanges the connection destinations of the capacitors C1 and C2. The delay circuit DLY3 can therefore be returned to the initial state even when voltage fluctuations are not negligible.

Fourth Embodiment

In the above-described embodiments, the reset signal $S_{RST}$ is input from an external device and coordination with the external device is required. In the fourth embodiment, the reset signal $S_{RST}$ is internally generated.

Figure 6:
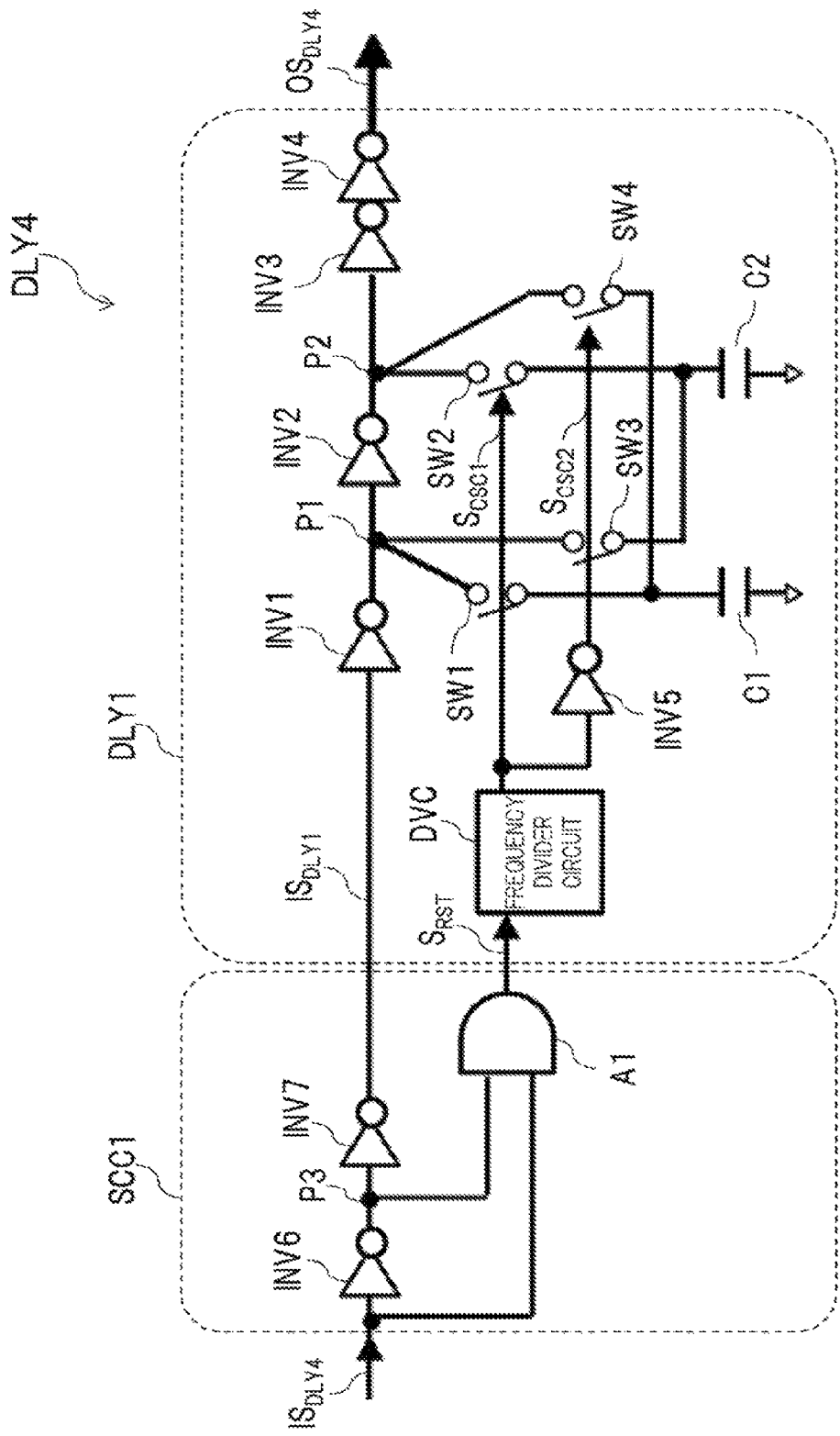
FIG. 6 is a block diagram schematically illustrating an example configuration of a delay circuit according to a fourth embodiment.

FIG. 6 is a block diagram schematically illustrating an example configuration of a delay circuit according to the fourth embodiment. A delay circuit (DLY4) according to this embodiment further includes a first signal control circuit (SCC1) in addition to the delay circuits according to the above-described embodiments. The signal control circuit SCC1 includes two inverters (INV16 and INV17) and one AND gate (A1).

The signal control circuit SCC1 receives the input signal $IS_{DLY4}$ for the delay circuit DLY4. The signal control circuit SCC1 inputs the input signal $IS_{DLY1}$ and the reset signal $S_{RST}$ to the delay circuit DLY1 in accordance with the input signal $IS_{DLY4}$ for the delay circuit DLY4.

The internal configuration of the signal control circuit SCC1 will now be described. The inverters INV6 and INV7 are serially connected. The node of the inverters INV6 and INV7 is denoted by P3. The output terminal of the inverter INV7 is connected to the input terminal of the inverter INV1. Accordingly, the inverter INV1 receives the output signal of the inverter INV7.

The AND gate A1 receives two input signals. One is the input signal $IS_{DLY4}$, and the other is the inverted signal of the input signal $IS_{DLY4}$. In the case shown in FIG. 6, the first input terminal of the AND gate A1 is connected to the input terminal of the inverter INV6, and the second input terminal of the AND gate A1 is connected to the node P3. The AND gate generates the reset signal $S_{RST}$ by AND operation between the two input signals and outputs it to the frequency divider circuit DVC of the delay circuit DLY1. Thus, the reset signal $S_{RST}$ is generated in the delay circuit DLY4.

Figure 7:
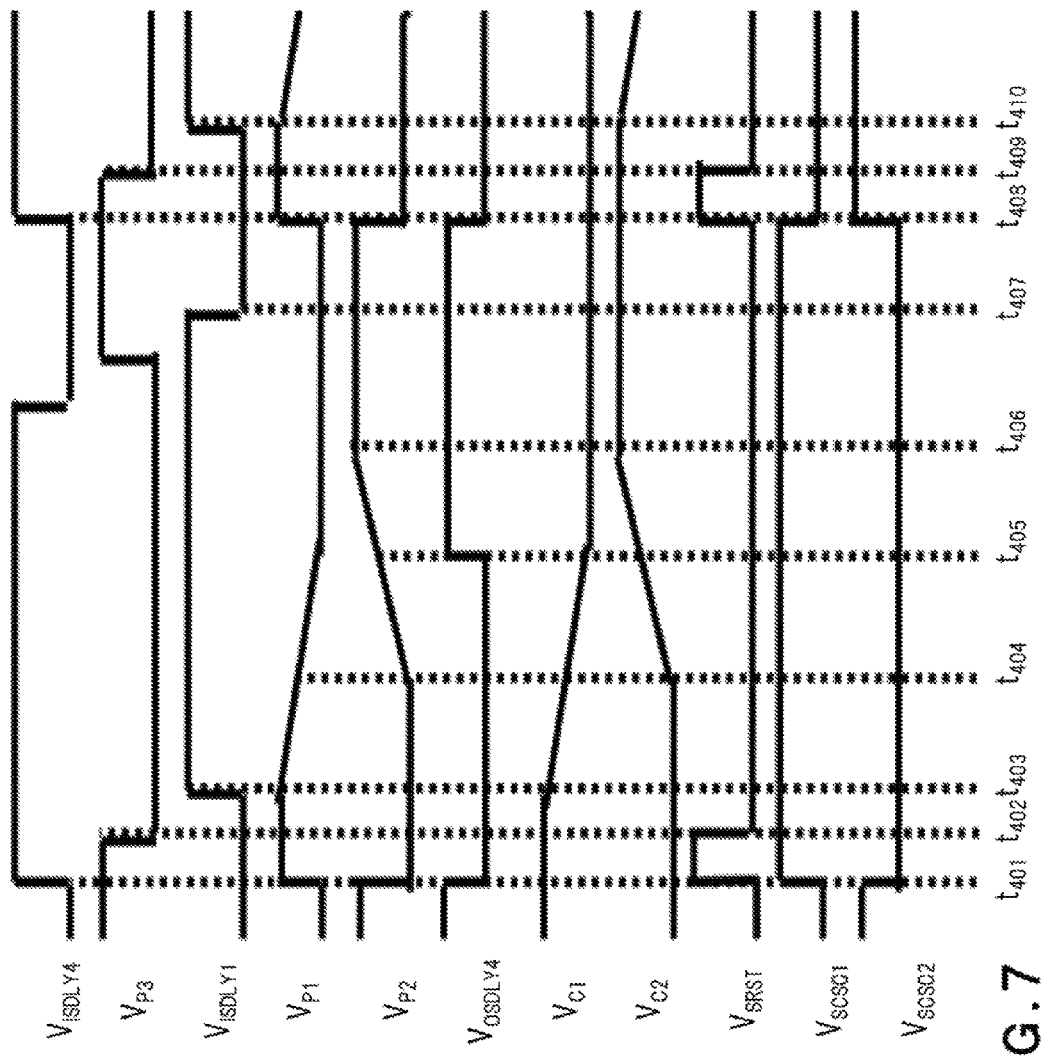
FIG. 7 shows the waveforms of the voltages in the delay circuit according to the fourth embodiment.

FIG. 7 shows the waveforms of the voltages in the delay circuit according to the fourth embodiment. As shown in FIG. 7, at the time t401 and the time t408, the voltage $V_{ISDLY4}$ of the input signal $IS_{DLY4}$ makes a Low to High transition. Because of the inverter INV6, at the time t402 and time t409 following the time t401 and time t408, respectively, the voltage $V_{P3}$ of the node P3 makes a High to Low transition. Consequently, the AND by the AND gate A1 is High and the voltage $V_{SRST}$ of the reset signal $S_{RST}$ is therefore High from the time t401 to the time t402 and from the time t408 to the time t409.

Meanwhile, because of the inverters INV6 and INV7, the voltage $V_{ISDLY1}$ of the input signal $IS_{DLY1}$ makes a Low to High transition at the time t403 and the time t410 coming after the time t401 and the time t408, respectively. In this manner, the voltage $V_{SRST}$ makes a Low to High transition before the voltage $V_{ISDLY1}$ makes a Low to High transition. Thus, the delay circuit can be returned to the initial state before the Low to High transition of the voltage $V_{ISDLY1}$.

As described above, in the fourth embodiment, the reset signal $S_{RST}$ is output in accordance with the input signal $IS_{DLY4}$ for the delay circuit DLY4, and the voltage of the reset signal $S_{RST}$ makes a transition during the period from a High to Low transition of the voltage of the input signal $IS_{DLY1}$ to the transition back to High. Hence, the delay circuit can be returned to the initial state without reception of the reset signal $S_{RST}$ from an external device with a coordinated timing.

Fifth Embodiment

Figure 8:
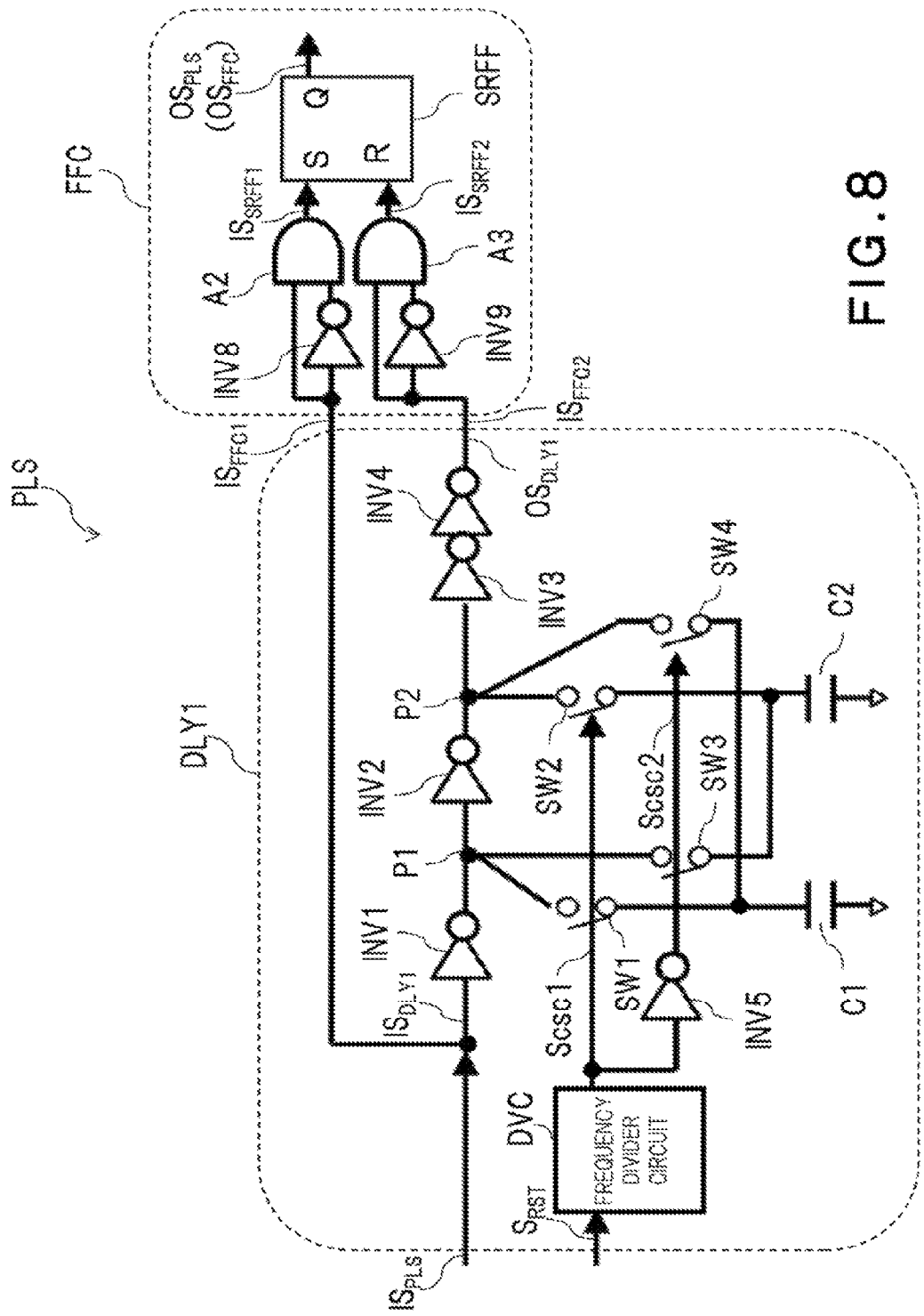
FIG. 8 is a block diagram schematically illustrating an example configuration of a pulse generator circuit according to a fifth embodiment.

This embodiment discloses a pulse generator circuit including the delay circuit according to any of the above-described embodiments. FIG. 8 is a block diagram schematically illustrating an example configuration of a pulse generator circuit according to the fifth embodiment. The pulse generator circuit (PLS) according to this embodiment includes a delay circuit according to any of the above-described embodiments and a flip-flop circuit (FFC). The flip-flop circuit FFC includes two inverters (INV8 and INV9), two AND gates (A2 and A3), and an SR flip-flop (SRFF).

The pulse generator circuit PLS according to this embodiment receives the input signal $IS_{PLS}$ and outputs the output signal $OS_{PLS}$ in the form of pulses. The input signal $IS_{PLS}$ is input to the delay circuit DLY1. The reset signal $S_{RST}$ may be sent from an external device as in the delay circuit DLY1 according to the first embodiment or internally generated as in the delay circuit DLY4 according to the fourth embodiment.

The flip-flop circuit FFC receives the output signal $OS_{DLY1}$ from the delay circuit DLY1 and the input signal $IS_{PLS}$ for the pulse generator circuit PLS, and outputs the output signal $OS_{FFC}$. The output signal $OS_{PLS}$ and the output signal $OS_{FFC}$ refer to the same signal.

The internal configuration of the flip-flop circuit FFC will now be described. The input terminal of the inverter INV8 receives the input signal $IS_{PLS}$. The input terminal of the inverter INV8 is connected to the first input terminal of the AND gate A2, so that the input signal $IS_{PLS}$ is also fed to the AND gate A2. The output terminal of the inverter INV8 is connected to the second input terminal of the AND gate A2. Hence, the AND gate A2 also receives the output signal of the inverter INV8.

The input terminal of the inverter INV9 receives the output signal $OS_{DLY1}$ of the delay circuit DLY1. The input terminal of the inverter INV9 is connected to the first input terminal of the AND gate A3, so that the output signal $OS_{DLY1}$ is also fed to the AND gate A3. The output terminal of the inverter INV9 is connected to the second input terminal of the AND gate A3. Hence, the AND gate A3 also receives the output signal of the inverter INV9.

The SR flip-flop SRFF receives the output signal of the AND gate A2 at the set terminal (S in FIG. 8), and the output signal of the AND gate A3 at the reset terminal (R in FIG. 8). The signal received at the set terminal is denoted by $IS_{SRFF1}$ and the signal received at the reset terminal is denoted by $IS_{SRFF2}$. The SR flip-flop SRFF outputs the output signal $OS_{FFC}$ based on the signals $IS_{SRFF1}$ and $IS_{SRFF2}$.

Figure 9:
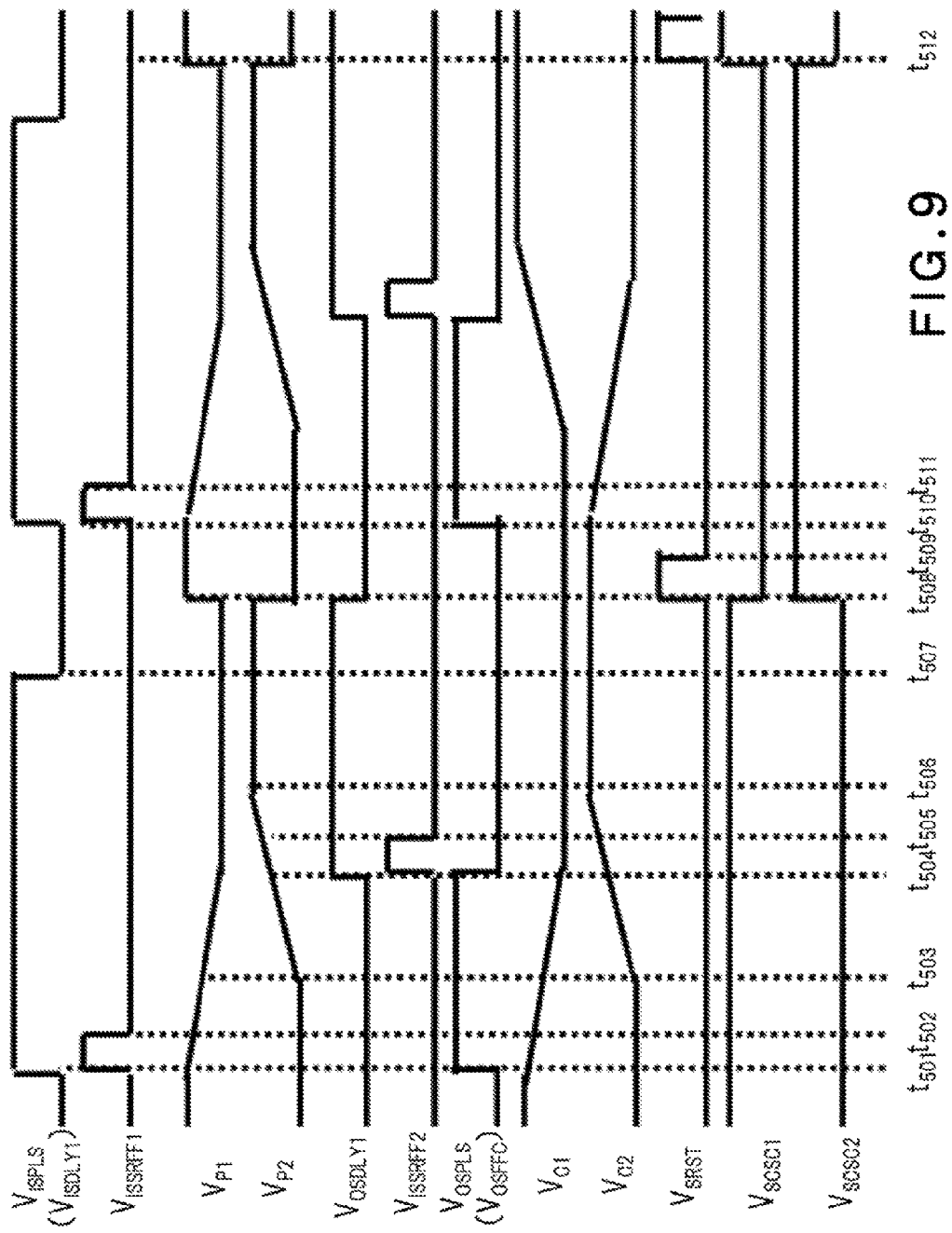
FIG. 9 shows the waveforms of the voltages in the pulse generator circuit according to the fifth embodiment.

FIG. 9 shows the waveforms of the voltages in the pulse generator circuit according to the fifth embodiment. Suppose that the voltage $V_{ISPLS}$ of the input signal $IS_{PLS}$ becomes High at the time t501. Suppose also that at the time t502, the voltage $V_{ISPLS}$ becomes High and the voltage of the output signal of the inverter INV8 therefore becomes Low. Then, the voltage $V_{ISSRFF1}$ of the input signal $IS_{SRFF1}$ supplied from the AND gate A2 to the set terminal stays High from the time t501 to t502. Since the voltage $V_{ISSRFF1}$ becomes High, the voltage $V_{OSFFC}$ of the output signal $OS_{FFC}$ also becomes High at the time t501.

Suppose that, the voltage $V_{OSDLY1}$ of the output signal $OS_{DLY1}$ becomes High at the time t504 because of the delay processing of the delay circuit DLY1, after the time t501 at which the voltage $V_{ISPLS}$ becomes High. Suppose also that at the time t505, the voltage $V_{OSDLY1}$ becomes High and the output signal of the inverter INV9 therefore becomes Low. Then, the voltage $V_{ISSRFF2}$ of the input signal $IS_{SRFF2}$ supplied from the AND gate A3 to the reset terminal stays High from the time t504 to t505. Thus, the voltage $V_{OSFFC}$ makes a High to Low transition at the time t504.

Pulse waves are generated from the time t501 to t504 in this manner. At the time t501, the voltage $V_{ISPLS}$ of the input signal $IS_{PLS}$ received by the delay circuit DLY1 becomes High. At the time t504, the voltage $V_{OSPLS}$ of the output signal $OS_{PLS}$ from the delay circuit DLY1 becomes High. Thus, the pulse width of the pulse waves can be adjusted using the delay time of the delay circuit DLY1.

As described above, the pulse generator circuit according to the fifth embodiment achieves low power consumption and outputs pulse waves with a pulse width according to the internal delay time of the delay circuit.

Sixth Embodiment

Figure 10:
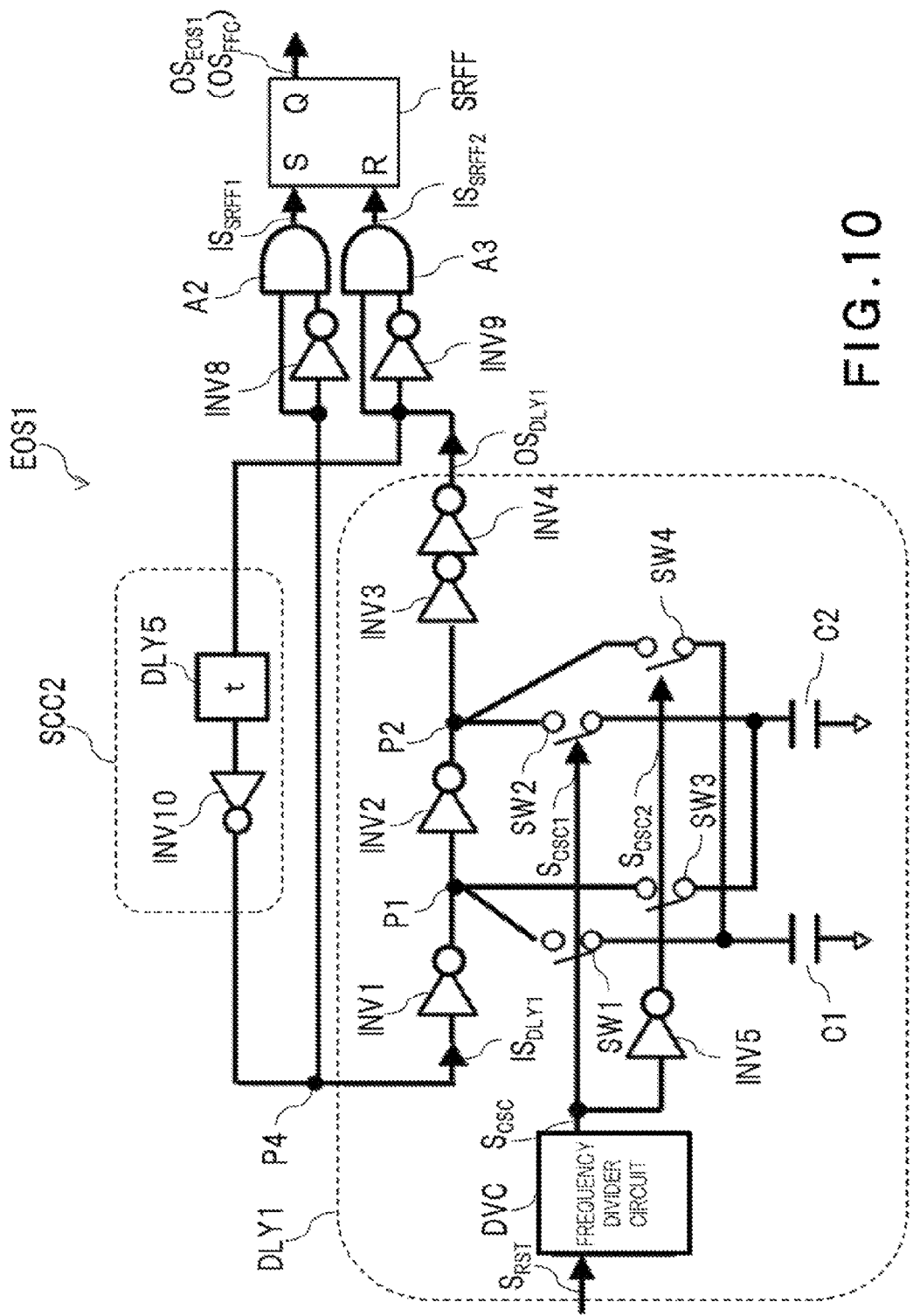
FIG. 10 is a block diagram schematically illustrating an example configuration of an oscillator circuit according to a sixth embodiment.

This embodiment discloses an oscillator circuit including the pulse generator circuit according to the fifth embodiment. FIG. 10 is a block diagram schematically illustrating an example configuration of an oscillator circuit according to the sixth embodiment. The oscillator circuit (EOS1) according to the sixth embodiment includes the pulse generator circuit PLS according to the fifth embodiment and a second signal control circuit (SCC2). The signal control circuit SCC2 includes another delay circuit (DLY5) and an inverter (INV10). The delay circuit DLY5 may be any of the delay circuits according to the above-described embodiments or a different delay circuit.

In the oscillator circuit EOS1, the input signal $IS_{DLY1}$ in the delay circuit DLY1 included in the pulse generator circuit PLS is not fed from an external device but generated from the output signal $OS_{DLY1}$ of the delay circuit DLY1. Like the pulse generator circuit PLS, the oscillator circuit EOS1 produces an output signal $OS_{EOS1}$ ($OS_{FFC}$) having a pulse width dependent on the delay time of the delay circuit.

In the case shown in FIG. 10, the oscillator circuit EOS1, which includes the delay circuit DLY1, receives the reset signal $S_{RST}$ from an external device. If the oscillator circuit EOS1 includes the delay circuit DLY4, the reset signal $S_{RST}$ is generated in the oscillator circuit EOS1. If the reset signal $S_{RST}$ is fed from the external device, the fed reset signal $S_{RST}$ may be in sync with the output signal $OS_{FFC}$, for example.

The signal control circuit SCC2 receives the output signal $OS_{DLY1}$ from the delay circuit DLY1. The signal control circuit SCC2 inputs the input signal $IS_{DLY1}$ to the delay circuit DLY1 in accordance with the output signal $OS_{DLY1}$. The signal control circuit SCC2 loops the output signal $OS_{DLY1}$ from the delay circuit DLY1.

The internal configuration of the signal control circuit SCC2 will now be described. The delay circuit DLY5 and the inverter INV10 are connected in series. The input terminal of the delay circuit DLY5 is connected to the output terminal of the delay circuit DLY1. Hence, the output signal $OS_{DLY1}$ of the delay circuit DLY1 is fed to the inverter INV10 delayed in accordance with the delay time of the delay circuit DLY5.

The inverter INV10 outputs the inverted signal of the output signal $OS_{DLY1}$ delayed by the delay circuit DLY5. The output terminal of the inverter INV10 is connected to the input terminal of the inverter INV1. Hence, the output signal of the inverter INV10 corresponds to the input signal $IS_{DLY1}$ of the delay circuit DLY1. The node of the output terminal of the inverter INV10 and the input terminal of the inverter INV1 is denoted by P4.

The input terminal of the inverter INV8 and the first input terminal of the AND gate A2 are connected to the node P4. Thus, as in the fifth embodiment, the output signal of the inverter INV10, that is, the input signal $IS_{DLY1}$ is fed to the inverter INV8 and the AND gate A2.

Figure 11:
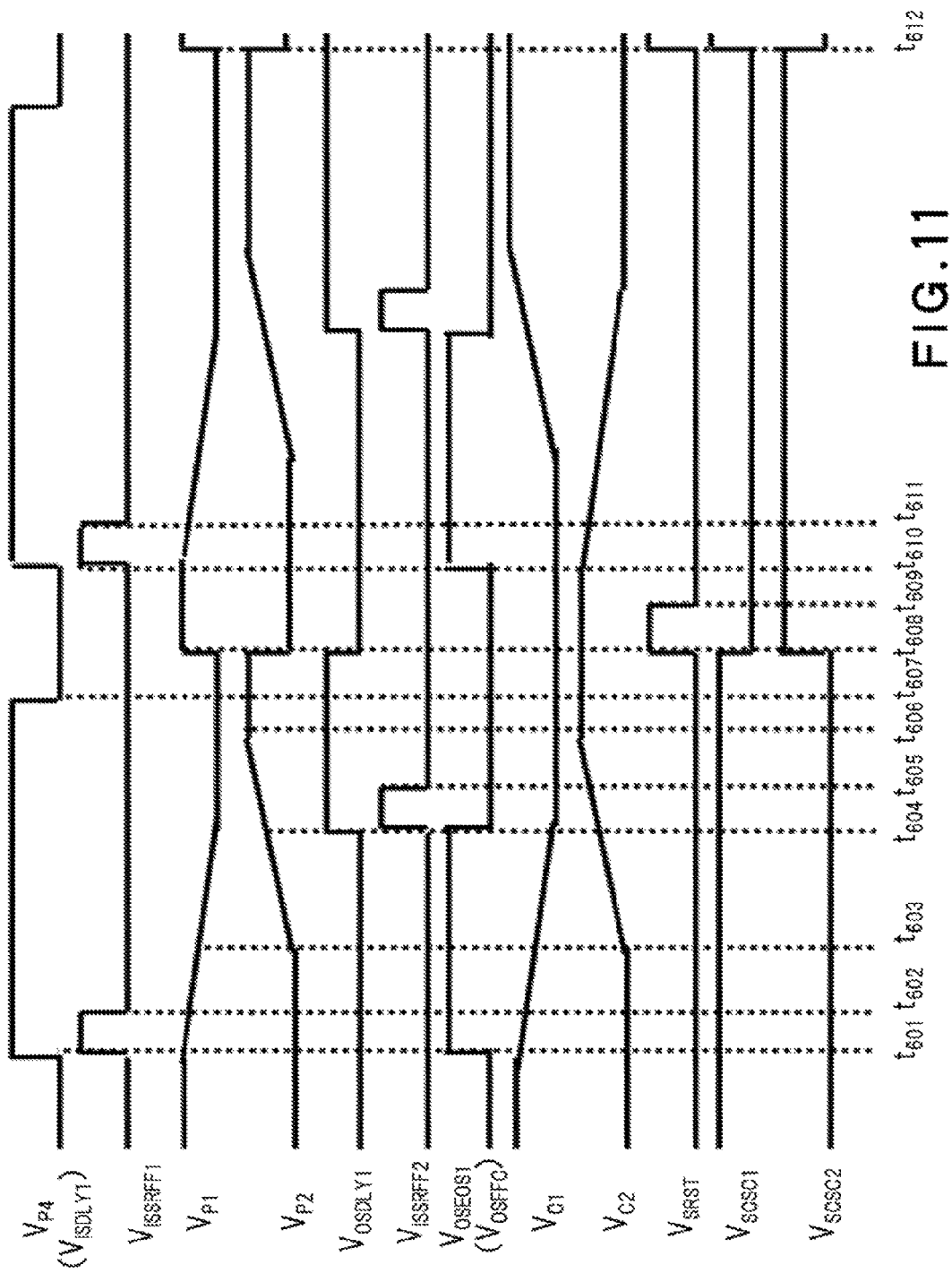
FIG. 11 shows the waveforms of the voltages in the oscillator circuit according to the sixth embodiment.

FIG. 11 shows the waveforms of the voltages in the oscillator circuit according to the sixth embodiment. From the time t601 to t604, the operations of the delay circuit DLY1 and the flip-flop circuit FFC and changes in voltage in the oscillator circuit EOS1 are the same as in the fifth embodiment except that the voltage $V_{ISPLS}$ of the input signal $IS_{PLS}$ is replaced by the voltage $V_{P4}$ of the node P4. Accordingly, the delay time of the delay circuit DLY1 determines the period in which the voltage $V_{OSFFC}$ of the output signal $OS_{FFC}$ of the SR flip-flop is High.

The output signal $OS_{DLY1}$ of the delay circuit DLY1 is fed to the delay circuit DLY5 and fed to the inverter INV10 after the delay time of the delay circuit DLY5 lapses. Afterwards, the voltage $V_{P4}$ of the node P4 changes due to the inverter INV10. In the case shown in FIG. 11, due to the delay time of the delay circuit DLY5, the influence of the voltage $V_{OSDLY1}$, which is High from the time t604, occurs at the time t607. Therefore, the voltage $V_{P4}$ makes a transition to Low at the time t607.

The transition of the voltage $V_{P4}$ to Low means the transition of the voltage $V_{ISDLY1}$ of the input signal $IS_{DLY1}$ of the delay circuit DLY1 to Low. Accordingly, the reset signal $S_{RST}$ is fed at the time t608 following the time t607. The reset signal $S_{RST}$ forces the output signal voltage $V_{OSDLY1}$ to become Low.

If the voltage $V_{OSDLY1}$ becomes Low, the voltage $V_{P4}$ returns to High after the delay time of the delay circuit DLY5. In FIG. 11, the voltage $V_{P4}$ returns to High at the time t610 after the time t608. Consequently, the voltage $V_{ISFF1}$ of the input signal $IS_{FF1}$ to the SR flip-flop SRFF returns to High, and the voltage $V_{OSFFC}$ becomes High at the time t610.

As explained above, the delay circuit DLY5 forces the voltage of the node P4 to make a transition at the time t607 coming after the time t604 and the time t610 coming after time t608, and the voltage of the output signal $OS_{FF}$ of the SR flip-flop SRFF therefore stays Low from the time t604 to the time t610. Hence, the delay time of the delay circuit DLY5 determines the period in which the output signal $OS_{FFC}$ of the SR flip-flop is Low.

In this manner, the pulse generator circuit according to the sixth embodiment achieves low power consumption and outputs pulse waves having a pulse width dependent on the delay time given by the two delay circuits included therein.

Seventh Embodiment

Figure 12:
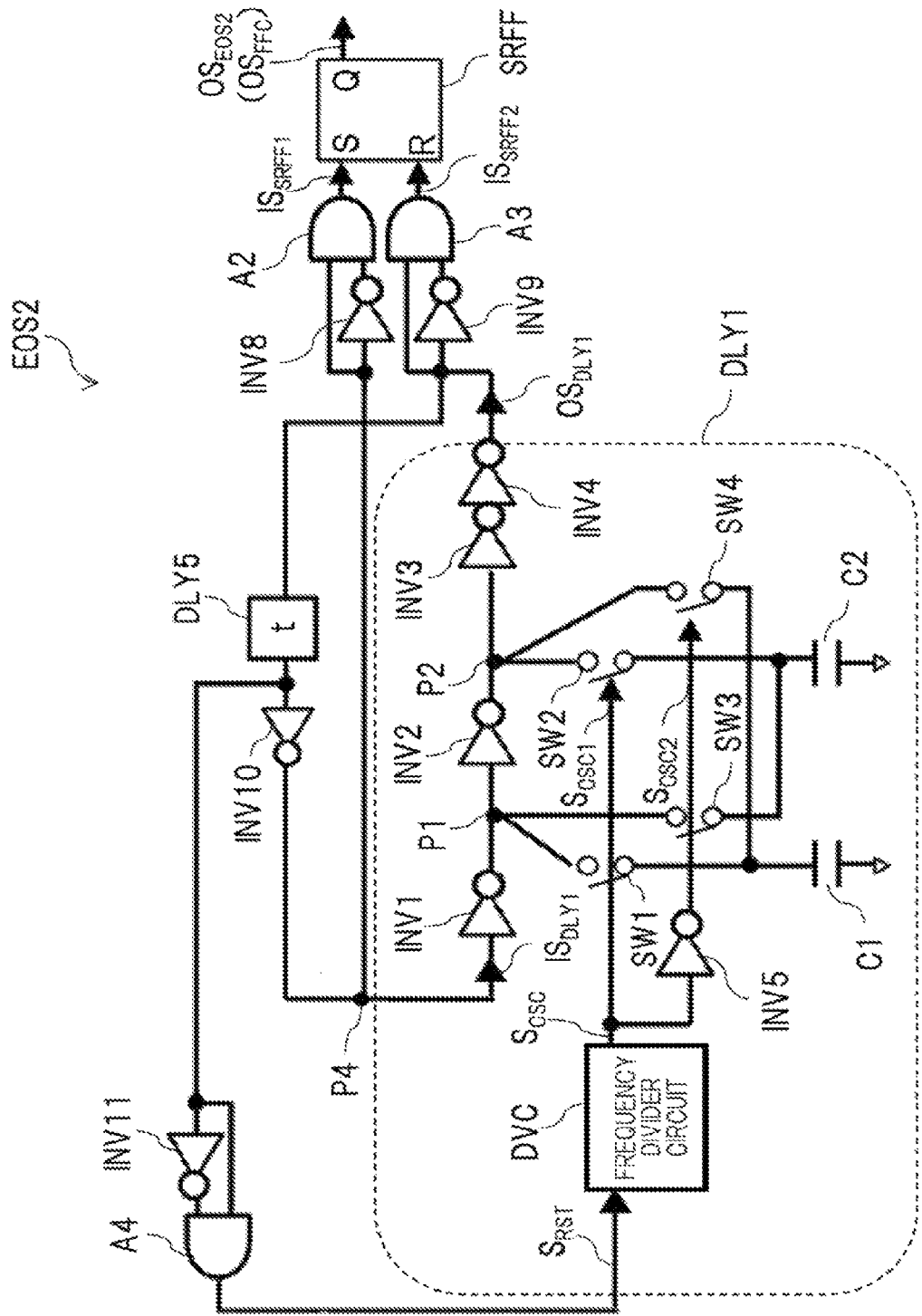
FIG. 12 is a block diagram schematically illustrating an example configuration of an oscillator circuit according to a seventh embodiment.

This embodiment discloses an oscillator circuit that generates the reset signal $S_{RST}$ therein. FIG. 12 is a block diagram schematically illustrating an example configuration of an oscillator circuit according to the seventh embodiment. The oscillator circuit (EOS2) according to the seventh embodiment is the same as the oscillator circuit according to the sixth embodiment except that the second signal control circuit further includes an inverter INV11 and an AND gate A4.

The oscillator circuit EOS2 generates the reset signal $S_{RST}$ from the output signal $OS_{DLY1}$ of the delay circuit DLY1. Accordingly, unlike in the sixth embodiment, among the two delay circuits included in the oscillator circuit EOS2, the delay circuit other than the delay circuit DLY5 may be a delay circuit according to any of the first to third embodiments and cannot be the delay circuit DLY4 according to the fourth embodiment which generates the reset signal $S_{RST}$ from the input signal $IS_{DLY1}$.

The input terminal of the inverter INV11 and the first input terminal of the AND gate A4 are connected between the delay circuit DLY5 and the inverter INV10. The output terminal of the inverter INV11 is connected to the first input terminal of the AND gate A4. Thus, the output signal of the inverter INV11 corresponds to the second input signal of AND4. The output signal of the AND gate A4 is fed to the frequency divider circuit DVC as the reset signal $S_{RST}$.

Figure 13:
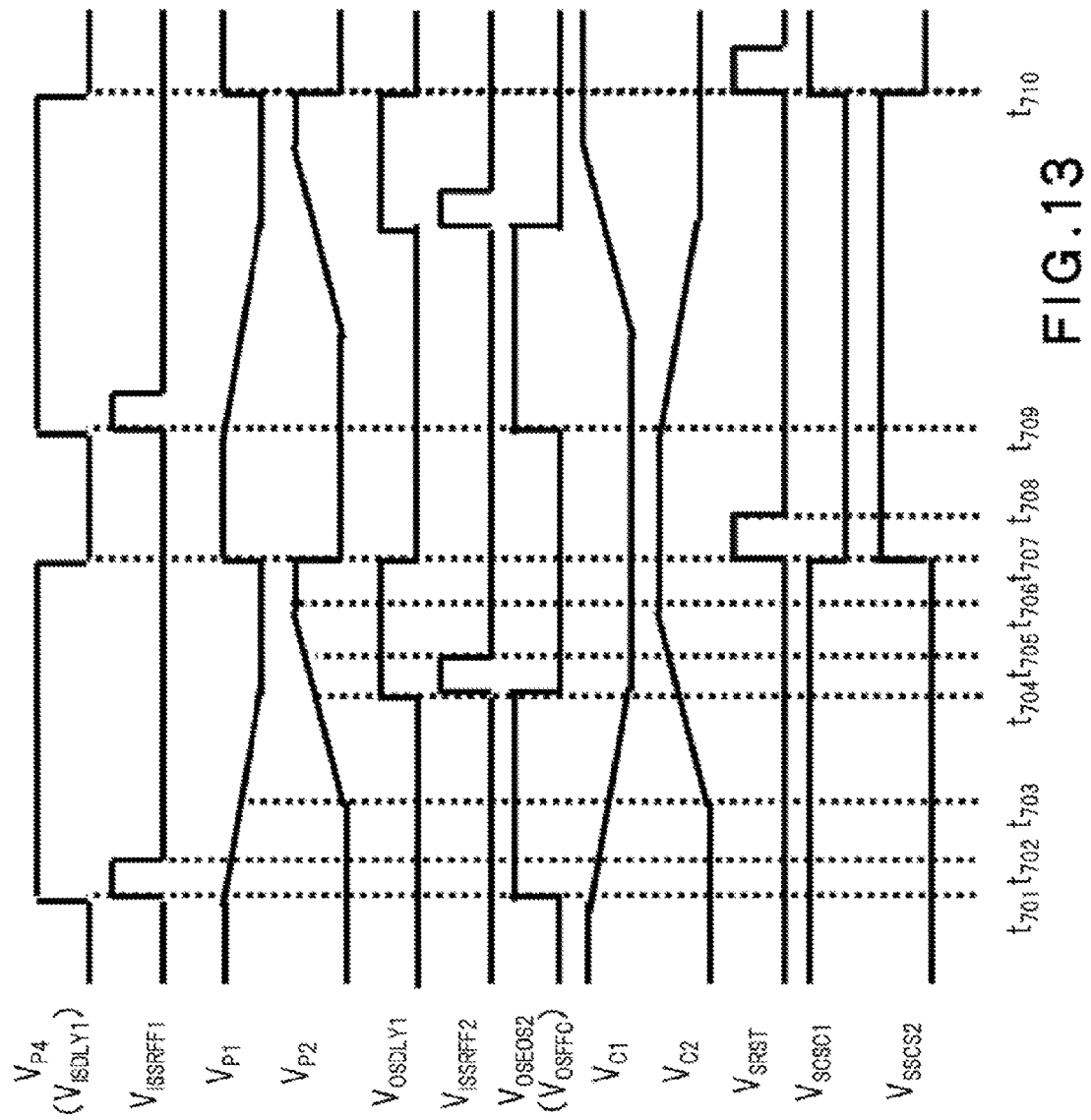
FIG. 13 shows the waveforms of the voltages in the oscillator circuit according to the seventh embodiment.

FIG. 13 shows the waveforms of the voltages in the oscillator circuit according to the seventh embodiment. Like the sixth embodiment, the voltage $V_{P4}$ of the node P4 depends on the voltage $V_{OSDLY1}$ of the output signal $OS_{DLY1}$ and the delay time of the DLY5. In the case shown in FIG. 13, the voltage $V_{OSDLY1}$ makes a Low to High transition at the time t704. The output signal of the delay circuit DLY5 is sent to the inverter INV10 at the time t707 coming after the time t704. Hence, the voltage $V_{P4}$ of the node P4 receiving the output of the inverter INV10 makes a High to Low transition at the time t707 coming after the time t704.

The reset signal $S_{RST}$ in this embodiment also depends on the voltage $V_{OSDLY1}$ of the output signal $OS_{DLY1}$ and the delay time of DLY5. The output signal of the delay circuit DLY5 after the Low to High transition is sent to the inverter INV11 and the AND gate A4 at the time t707 coming after the time t704. Since the voltage of the output signal of the inverter INV11 does not become Low immediately, the voltage of the output signal of the AND gate A4 becomes High at the time t707. Since the output signal of the AND gate A4 is sent to the frequency divider circuit DVC as the reset signal $S_{RST}$, the voltage $V_{SRST}$ of the reset signal $S_{RST}$ becomes High at the time t707. Thus, the falling edge of the input signal $IS_{DLY1}$ DLY1 is in sync with the rising edge of the reset signal $S_{RST}$. Consequently, the reset signal $S_{RST}$ is fed to the frequency divider circuit DVC after the voltage $V_{ISDLY1}$ of the input signal $IS_{DLY1}$ becomes Low and before it returns to High, and the oscillator circuit can be returned to the initial state before the voltage $V_{ISDLY1}$ becomes High.

It should be noted that this embodiment may exclude the flip-flop circuit FFC. The delay circuit DLY1 operates in the same manner even without the flip-flop circuit FFC. A circuit without the flip-flop circuit FFC corresponds to a delay circuit or oscillator circuit which is similar to the delay circuit according to any of the first to third embodiments but further includes a third signal control circuit (SCC3). In contrast, this embodiment corresponds to an oscillator circuit including the delay circuit and a flip-flop circuit FFC.

As described above, in the seventh embodiment, the reset signal $S_{RST}$ is generated from the output signal $OS_{DLY1}$ of the delay circuit DLY1, and the oscillator circuit can return to the initial state before the input signal $IS_{DLY1}$ to the delay circuit DLY1 returns to High from Low.

Eighth Embodiment

The oscillator circuit according to this embodiment starts and stops operation in accordance with an external signal. The external signal for instructing the start or stop of operation is referred to as "operation control signal $S_{STP}$".

Figure 14:
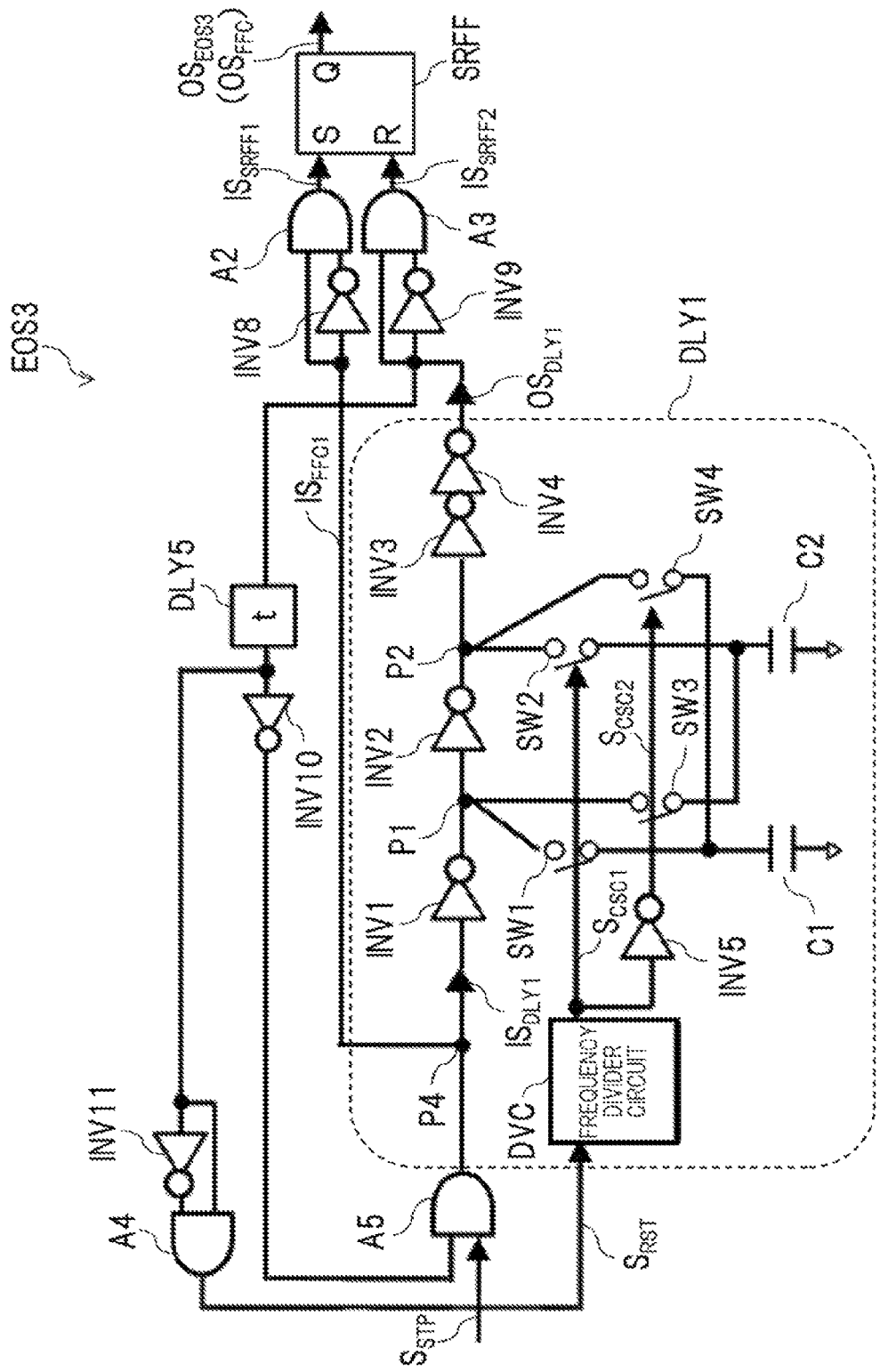
FIG. 14 is a block diagram schematically illustrating an example configuration of an oscillator circuit according to an eighth embodiment.

FIG. 14 is a block diagram schematically illustrating an example configuration of an oscillator circuit according to the eighth embodiment. The oscillator circuit EOS3 according to this embodiment is similar to the oscillator circuit according to the sixth or seventh embodiment but further includes an AND gate A5.

The first input terminal of the AND gate A5 receives the operation control signal $S_{STP}$. The second input terminal of the AND gate A5 is connected to the output terminal of the inverter INV10. Accordingly, the output signal of the inverter INV10 is fed to the second input terminal of the AND gate A5. The output terminal of the AND gate A5 is connected to the node P4. The output signal of the AND gate A5 is therefore used as the input signal $IS_{DLY1}$ to the delay circuit DLY1 and the first input signal $IS_{FFC1}$ to the flip-flop circuit FFC.

The voltage of the input signal $IS_{DLY1}$ to the delay circuit DLY1 is determined by AND operation between the voltage of the output signal of the inverter INV10 and the voltage of the stop signal $S_{STP}$. Accordingly, when the voltage of the stop signal $S_{STP}$ is High, the output signal of the inverter INV10 is in sync with the input signal $IS_{DLY1}$. Thus, when the stop signal $S_{STP}$ is High, the oscillator circuit EOS3 operates in the same manner as in the sixth or seventh embodiment.

In contrast, when the voltage of the stop signal $S_{STP}$ is Low, the voltage of the input signal $I_{SDLY1}$ becomes Low independently of the output signal of the inverter INV10. In the sixth or seventh embodiment, even if the voltage of the input signal $IS_{DLY1}$ becomes Low, inversion by the inverter INV10 forces the voltage of the input signal $IS_{DLY1}$ to become High after the delay time given by the delay circuit DLY1 and the delay circuit DLY5. However, while the voltage of the stop signal $S_{STP}$ is held Low, the voltage of the input signal $IS_{DLY1}$ also stays Low. Consequently, the oscillator circuit EOS3 does not oscillate. In this way, the stop signal $S_{STP}$ can control the start and stop of the oscillator circuit EOS3.

As described above, the oscillator circuit according to the eighth embodiment can control start and stop in accordance with the stop signal $S_{STP}$.

Ninth Embodiment

Figure 15:
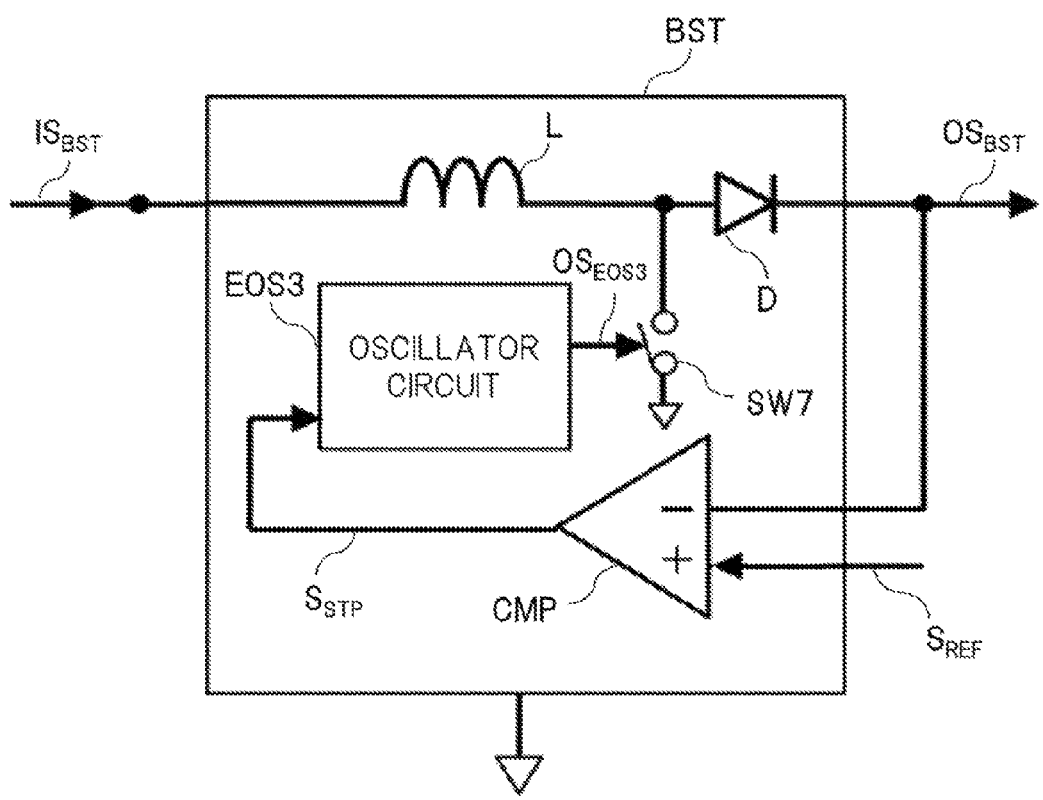
FIG. 15 is a block diagram schematically illustrating an example configuration of a boost converter according to a ninth embodiment.

This embodiment discloses a boost converter including the oscillator circuit according to the eighth embodiment. FIG. 15 is a block diagram schematically illustrating an example configuration of a boost converter according to the ninth embodiment. The boost converter (BST) according to this embodiment includes an inductor L, a diode D, a comparator CMP, the oscillator circuit EOS3 according to the eighth embodiment, and a switch SW7.

The boost converter BST receives the input signal $IS_{BST}$ and the reference signal $S_{REF}$ from an external device. The boost converter BST gradually boosts the input signal $IS_{BST}$ and thereby outputs the voltage of the output signal $OS_{BST}$ which is higher than the voltage of the input signal $IS_{BST}$. When the voltage of the output signal $OS_{BST}$ exceeds the voltage of the reference signal $S_{REF}$, boosting by the boost converter BST stops. This boosting is performed in accordance with the output signal of the oscillator circuit EOS3 according to the eighth embodiment. It should be noted that the boost converter BST is connected to the ground voltage $V_{GND}$.

The input terminal of the inductor L receives the input signal $IS_{BST}$. The output terminal of the inductor L is connected to the input terminal of the diode D.

The input terminal of the diode D receives the output signal of the inductor L. The output terminal of the diode D outputs the output signal $OS_{BST}$. The output terminal of the diode 1 is connected to the first input terminal of the comparator CMP.

The comparator CMP receives the output signal $OS_{BST}$ from the first input terminal, and the reference signal $S_{REF}$ from the second input terminal. The comparator CMP performs comparison between the voltage of the reference signal $S_{REF}$ and the voltage of the output signal $OS_{BST}$ and then outputs a comparison signal. If the voltage of the reference signal $S_{REF}$ is lower, the voltage of the comparison signal becomes High. If the voltage of the reference signal $S_{REF}$ is higher, the voltage of the comparison signal becomes Low.

The oscillator circuit EOS3 receives the comparison signal as the stop signal $S_{STP}$. If the voltage of the reference signal $S_{REF}$ is lower, the oscillator circuit EOS3 oscillates and therefore produces an output regularly switching between High and Low. If the voltage of the reference signal $S_{REF}$ is lower, the oscillator circuit EOS3 stops oscillating and therefore keeps producing a Low output.

One terminal of the switch SW5 is connected to the input terminal of the diode and the other is grounded. The output signal of the oscillator circuit serves as the connection control signal for the switch SW5. If the voltage of the reference signal $S_{REF}$ is lower, the oscillator circuit EOS3 produces an output regularly switching between High and Low and the switch SW5 therefore repeatedly switches on and off. Thus, boosting is performed. If the voltage of the reference signal $S_{REF}$ is lower, the oscillator circuit EOS3 stops oscillating and therefore keeps producing a Low output, leaving the switch SW5 off. Thus, boosting is stopped.

In this manner, boosting of performed by the boost converter BST is controlled by the oscillator circuit EOS3. The boost converter BST may have any configuration with which a rise in the voltage of the output signal $OS_{BST}$ of the boost converter BST is stopped in accordance with the output signal of the oscillator circuit EOS3.

It should be noted that the boost converter according to this embodiment may be used as a component of the power supply circuit.

As described above, the boost converter according to the ninth embodiment, which includes the oscillator circuit according to the eighth embodiment, can achieve low power consumption.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. An electronic circuit comprising:
a first logic circuit having a first output terminal from which a first output signal based on a first input signal is output;
a second logic circuit having a second output terminal from which a second output signal obtained by inversion of the first output signal is output in a steady state;
first and second capacitors each having one terminal at a first voltage; and
a connection circuit configured to connect one of the first output terminal and the second output terminal to the first capacitor and connect the other to the second capacitor, wherein
the connection circuit is configured to interchange connection destinations of the first capacitor and the second capacitor in accordance with a received first connection control signal.

2. The electronic circuit according to claim 1, wherein a voltage of the first connection control signal makes a transition during a period from transition of a voltage of the first input signal from a predetermined value to a transition back to the predetermined value.

3. The electronic circuit according to claim 1, wherein the connection circuit comprises:
a first switch configured to switch a connection state between the first output terminal and another terminal of the first capacitor in accordance with the first connection control signal;
a second switch configured to switch a connection state between the second output terminal and another terminal of the second capacitor in accordance with the first connection control signal;
a third switch configured to switch a connection state between the first output terminal and the other terminal of the second capacitor in accordance with a second connection control signal obtained by inversion of the first connection control signal; and
a fourth switch configured to switch a connection state between the second output terminal and the other terminal of the first capacitor in accordance with the second connection control signal.

4. The electronic circuit according to claim 1, further comprising a current source connected to at least one of the first logic circuit and the second logic circuit and configured to increase and decrease flowing current.

5. The electronic circuit according to claim 1, further comprising a fifth switch configured to switch a connection state between the first output terminal or the second output terminal and a second voltage at the same time as when the connection circuit interchanges connection destinations of the first capacitor and the second capacitor.

6. The electronic circuit according to claim 5, further comprising:
a first signal control circuit configured to output the first input signal and a third connection control signal in accordance with a second input signal; and
a frequency divider circuit configured to output the first connection control signal in accordance with the third connection control signal.

7. The electronic circuit according to claim 5, further comprising:
a second signal control circuit configured to output the first input signal and a third connection control signal in accordance with the second output signal; and
a frequency divider circuit configured to output the first connection control signal in accordance with the third connection control signal.

8. The electronic circuit according to claim 1, further comprising:
a flip-flop circuit configured to output pulse waves in accordance with the first input signal, and the second output signal or a third output signal according to the second output signal.

9. The electronic circuit according to claim 1, further comprising:
a flip-flop circuit configured to output pulse waves in accordance with the first input signal, and the second output signal or a third output signal according to the second output signal; and
a third signal control circuit configured to output the first input signal in accordance with the third output signal.

10. The electronic circuit according to claim 7, further comprising:
a flip-flop circuit configured to output pulse waves in accordance with the same signal as the first input signal, and the second output signal or a third output signal according to the second output signal.

11. The electronic circuit according to claim 9, wherein the third signal control circuit is configured to output the first input signal further in accordance with a received operation control signal.

12. A boost converter configured to output, in accordance with a third input signal and a reference signal, a fourth output signal boosted from the third input signal, the boost converter comprising:
an oscillator circuit configured to receive a comparison signal as an operation control signal and output a fifth output signal, the comparison signal being obtained by comparison between the fourth output signal and the reference signal, wherein the oscillator circuit comprises:
a delay circuit;
a flip-flop circuit configured to output the fifth output signal in accordance with a first input signal, and a second output signal or a third output signal according to the second output signal; and
a third signal control circuit configured to output the first input signal in accordance with the second output signal or the third output signal, and the operation control signal, wherein the delay circuit comprises:
- a first logic circuit having a first output terminal from which a first output signal based on the first input signal is output;
- a second logic circuit having a second output terminal from which the second output signal obtained by inversion of the first output signal is output in a steady state;
- first and second capacitors each having one terminal at a first voltage; and
- a connection circuit configured to connect one of the first output terminal and the second output terminal to the first capacitor and connect the other to the second capacitor, wherein the connection circuit is configured to interchange connection destinations of the first capacitor and the second capacitor in accordance with a received first connection control signal, and the boost converter is configured to stop a rise in voltage of the fourth output signal in accordance with the fifth output signal.

* * * * *